(12) United States Patent
Koole et al.

(10) Patent No.: US 10,030,851 B2
(45) Date of Patent: Jul. 24, 2018

(54) ENCAPSULATED QUANTUM DOTS IN POROUS PARTICLES

(71) Applicant: KONINKLIJKE PHILIPS N.V., Eindhoven (NL)

(72) Inventors: Roelof Koole, Eindhoven (NL); Marcel Rene Bohmer, Eindhoven (NL); Jan Cornelis Kriege, Eindhoven (NL); Godefridus Johannes Verhoeckx, Eindhoven (NL); Paulus Hubertus Gerardus Offermans, Eindhoven (NL); Patrick John Baesjou, Eindhoven (NL); Wilhelmus Cornelis Keur, Eindhoven (NL); Johannes Franciscus Maria Cillessen, Eindhoven (NL); Emile Johannes Karel Verstegen, Eindhoven (NL); Antonius Wilhelmus Maria De Laat, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 231 days.

(21) Appl. No.: 14/763,886

(22) PCT Filed: Mar. 19, 2014

(86) PCT No.: PCT/IB2014/059970
§ 371 (c)(1),
(2) Date: Jul. 28, 2015

(87) PCT Pub. No.: WO2014/147570
PCT Pub. Date: Sep. 25, 2014

(65) Prior Publication Data
US 2016/0084476 A1 Mar. 24, 2016

Related U.S. Application Data

(60) Provisional application No. 61/803,563, filed on Mar. 20, 2013.

(30) Foreign Application Priority Data

Feb. 4, 2014 (EP) .................................... 14153775
Mar. 13, 2014 (EP) .................................... 14159373

(51) Int. Cl.
*F21K 99/00* (2016.01)
*F21V 9/30* (2018.01)
(Continued)

(52) U.S. Cl.
CPC ................. *F21V 9/30* (2018.02); *B05D 1/18* (2013.01); *C09K 11/02* (2013.01); *C09K 11/025* (2013.01);
(Continued)

(58) Field of Classification Search
None
See application file for complete search history.

(56) References Cited

U.S. PATENT DOCUMENTS 6,322,901 B1 11/2001 Bawendi et al.
6,673,892 B2 1/2004 Martinez et al.
(Continued)

FOREIGN PATENT DOCUMENTS

CN 102492428 A 6/2012
CN 102690658 A 9/2012
(Continued)

OTHER PUBLICATIONS

Dung et al, "Optical Properties of Bare INP/ZNS Quantum Dots.." Department of Chemistry, Chonnam National University, Koreal.
(Continued)

*Primary Examiner* — Nathan T Leong

(57) ABSTRACT

The invention provides a process for the production of a (particulate) luminescent material comprising particles, especially substantially spherical particles, having a porous
(Continued)

inorganic material core with pores, especially macro pores, which are at least partly filled with a polymeric material with luminescent quantum dots embedded therein, wherein the process comprises (i) impregnating the particles of a particulate porous inorganic material with pores with a first liquid ("ink") comprising the luminescent quantum dots and a curable or polymerizable precursor of the polymeric material, to provide pores that are at least partly filled with said luminescent quantum dots and curable or polymerizable precursor; and (ii) curing or polymerizing the curable or polymerizable precursor within pores of the porous material, as well as a product obtainable thereby.

17 Claims, 16 Drawing Sheets

(51) Int. Cl.

| | | |
|---|---|---|
| C09K 11/02 | (2006.01) | |
| B05D 1/18 | (2006.01) | |
| C23C 16/40 | (2006.01) | |
| C23C 16/455 | (2006.01) | |
| F21V 9/16 | (2006.01) | |
| F21K 9/64 | (2016.01) | |
| F21Y 115/10 | (2016.01) | |

(52) U.S. Cl.
CPC ...... *C23C 16/403* (2013.01); *C23C 16/45525* (2013.01); *F21K 9/64* (2016.08); *F21V 9/16* (2013.01); *F21Y 2115/10* (2016.08)

(56) References Cited

U.S. PATENT DOCUMENTS

| | | | |
|---|---|---|---|
| 7,160,613 B2 | 1/2007 | Bawendi et al. | |
| 2005/0111805 A1 | 5/2005 | Hertz et al. | |
| 2007/0045777 A1 | 3/2007 | Gillies | |
| 2007/0161043 A1 | 7/2007 | Nie et al. | |
| 2009/0029563 A1 | 1/2009 | Hachiya | |
| 2011/0068321 A1 | 3/2011 | Pickett | |
| 2011/0068322 A1 | 3/2011 | Pickett et al. | |
| 2011/0241229 A1 | 10/2011 | Naasani et al. | |
| 2012/0009343 A1 | 1/2012 | Van Ommen | |
| 2012/0113671 A1 | 5/2012 | Sadasivan et al. | |
| 2012/0199747 A1 | 8/2012 | Letant et al. | |
| 2015/0291876 A1 | 10/2015 | Koole et al. | |

FOREIGN PATENT DOCUMENTS

| | | |
|---|---|---|
| EP | 0246875 A2 | 11/1987 |
| JP | 1991097639 A | 4/1991 |
| JP | 2012246393 A | 12/2012 |
| JP | 2013505347 A | 2/2013 |
| WO | 03093328 A1 | 11/2003 |
| WO | 2007084702 A2 | 1/2007 |
| WO | 2007099794 A1 | 9/2007 |
| WO | 2009035657 A1 | 3/2009 |
| WO | 2009140381 A1 | 11/2009 |
| WO | 2009145813 A1 | 12/2009 |
| WO | 2010014198 A1 | 2/2010 |
| WO | 2010100235 A1 | 9/2010 |
| WO | 2011031871 A1 | 3/2011 |
| WO | 2012021643 A2 | 2/2012 |
| WO | 2014064620 A1 | 5/2014 |

OTHER PUBLICATIONS

CN First Office Action dated Aug. 19, 2016, China Patent Application No. 201480016851.3, 24 pages.
Cai Jie et al., "Preparation and Property of the Mesoporous Silica Microspheres Embedded with Quantum Dots", Acta Chimica Sinica, vol. 66, No. 8, Mar. 31, 2008, pp. 923-929.
Xiaohu Gao, et al, "Doping Mesoporous Materials With Multicolor Quantum Dots", Journal of Physics Chemistry B, vol. 107, Jul. 25, 2003, pp. 11575-11578.
CN Second Office Action dated Mar. 27, 2017, China Patent Application No. 201480016851.3, 19 pages.
TW Office Action dated Jun. 13, 2017, Taiwan Patent Application No. 103110535, 19 pages.
JP Office Action dated Jul. 4, 2017, Japan Patent Application No. 2016-503766, 9 pages.
CN Third Office Action dated Jul. 20, 2017, China Patent Application No. 201480016851.3, 7 pages.
Taiwan Office Action dated Dec. 29, 2017, Taiwan Patent Application No. 103110535, 8 pages.
EPO as ISA, PCT/IB2014/059970 filed Mar. 19, 2014 "International Search Report and Written Opinion", dated Jun. 18, 2014, 8 pages.
Notice of Reason for Rejection dated Oct. 3, 2017, Japan Patent Application No. 2016-503766, 8 pages.
Final Office Action dated Mar. 13, 2018, Japanese Patent Application No. 2016-503766, 6 pages.

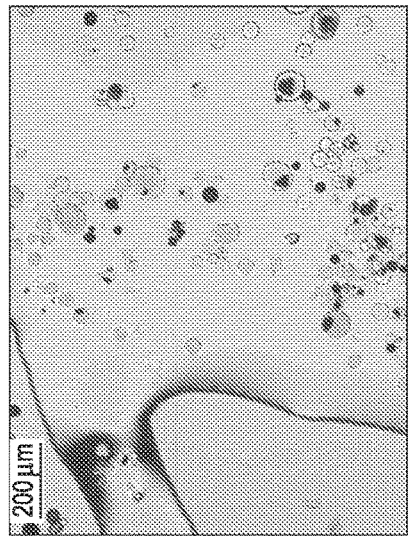
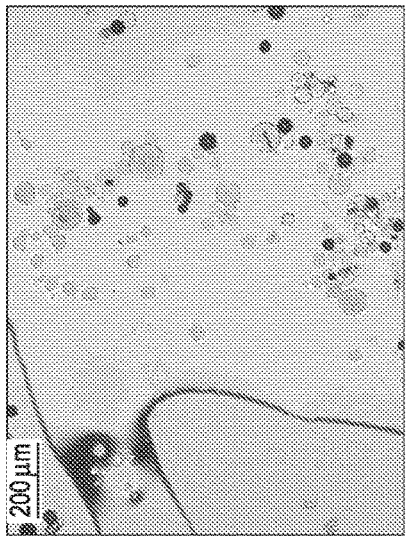
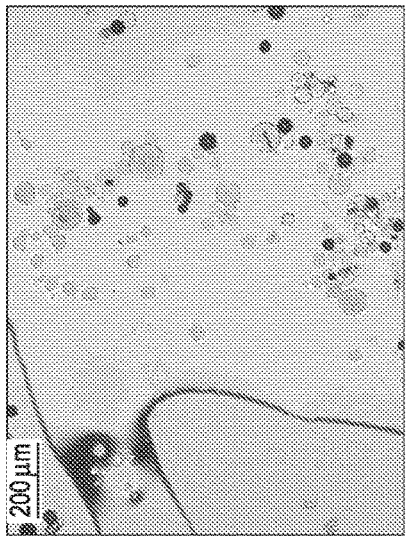
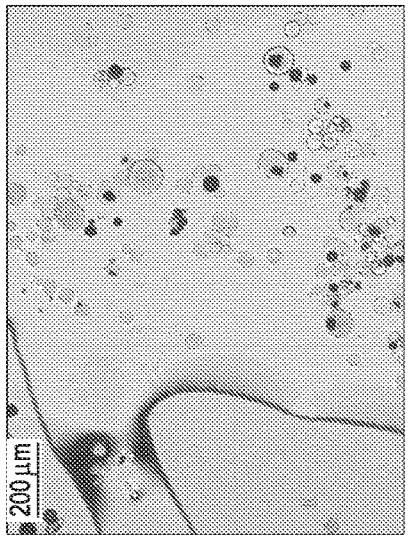
FIG. 3A T=0
FIG. 3B 10 sec
FIG. 3C 20 sec
FIG. 3D 60 sec Fluorescence Microscopy

ENCAPSULATED QUANTUM DOTS IN POROUS PARTICLES

CROSS-REFERENCE TO PRIOR APPLICATIONS

This application is the U.S. National Phase application under 35 U.S.C. § 371 of International Application No. PCT/IB2014/059970, filed on Mar. 19, 2014, which claims the benefit of U.S. Patent Application No. 61/803,563, filed on Mar. 20, 2013, EP Patent Application No. EP14153775.3, filed on Feb. 4, 2014 and EP Patent Application No. EP14159373.1 filed on Mar. 13, 2014. These applications are hereby incorporated by reference herein.

FIELD OF THE INVENTION

The invention relates to a (particulate) luminescent material, as well as to a production process for such (particulate) luminescent material. The invention further relates to a wavelength converter and lighting device comprising such (particulate) luminescent material.

BACKGROUND OF THE INVENTION

Quantum dot (QD) based lighting is known in the art. WO2012021643, for instance, describes systems and methods that relate to quantum dot structures for lighting applications. In particular, quantum dots and quantum dot containing inks (comprising mixtures of different wavelength quantum dots) are synthesized for desired optical properties and integrated with an LED source to create a trichromatic white light source. The LED source may be integrated with the quantum dots in a variety of ways, including through the use of a small capillary filled with quantum dot containing ink or a quantum dot containing film placed appropriately within the optical system. These systems may result in improved displays characterized by higher color gamuts, lower power consumption, and reduced cost. For instance, WO2012021643 describes a method of generating trichromatic white light comprising contacting light from a light source capable of emitting blue light with an optical material comprising a host material and first quantum dots capable of emitting green light and second quantum dots capable of emitting red light, wherein the weight percent ratio of the first quantum dots to the second quantum dots in the optical material is in a range from about 9:1 to about 2:1, and generating trichromatic white light from a combination of the light from the light source, the light from the first quantum dots and the light from the second quantum dots.

SUMMARY OF THE INVENTION

Nanoparticles such as quantum dots (QDs) can possess properties which make them advanced luminescent materials to be used in solid state lighting. Here below, nanoparticles, such as quantum dots, that have the ability to give (visible) luminescence are also indicated as "light converter nanoparticles" or "luminescent nanoparticles". They can e.g. be used in converting blue light to other colors, for obtaining high quality white light with high efficacy. Nanoparticles such as QDs have the advantage of a narrow emission band and color tunablility by varying the size of the particles.

Quantum Dots (QDs) are seen as a promising phosphor for LED applications. The narrow emission band (about 25-50 nm) and high quantum efficiency (QE) (>90% at 100° C.) makes them superior phosphors especially in the red, where alternative inorganic and organic phosphors show a much broader emission band. An overall improvement up to 20% in efficacy is expected in case QDs can be used as red phosphor in LEDs for general lighting applications. For backlight application the gain in efficacy can be even more, because the narrow band emission of both green and red QDs can be matched with the band pass filter of the LCD. All in all, QDs are envisaged to be an important green and/or red phosphor for LED applications in the near future.

A major problem of QDs towards application is their sensitivity towards oxygen and water. Due to photo-oxidation, and/or instability of the QD-ligand interface by photochemical reactions with water and/or oxygen, QDs need to be hermetically sealed from oxygen and water in order to remain their high QE upon light exposure and elevated temperature. One option is to seal/encapsulate the QDs on a module level, e.g. by sealing glass-sandwiches with an epoxy or other (semi-hermetic) seal. However, it is preferred to have a particulate material which is hermetically sealed on a micro-level.

Micro milling QDs in a first host towards micro particles and subsequent encapsulation of these particles or mixing the micro beads in another host is an option but may also have disadvantages. For example, the non-spherical shape and large size distribution which is obtained upon micro milling will hamper proper mixing of micro particles into a second host, and hinder hermetic encapsulation by a secondary coating. Another disadvantage of micro beads in general is the mismatch in thermal expansion coefficient between QD-host material (typically an acrylate, silicone, or other polymer) and the encapsulation material (preferably an inorganic material such as alumina or silica). A too large mismatch between thermal expansions may cause e.g. cracks. It was found that when using organic micro beads, which are known from the prior art, such micro beads, even when these are substantially spherical, can hardly be coated with an inorganic coating, which is a preferred coating, without substantial mismatch in thermal expansion. This may lead to life time reduction. An irregular shape such as obtained by micro milling increases the chance of crack-formation even further in case of a large CTE mismatch.

Hence, it is an aspect of the invention to provide a luminescent material, especially a particulate luminescent material, and/or a wavelength converter and/or a lighting device, which preferably further at least partly obviate one or more of above-described drawbacks. It is further an aspect of the invention to provide a process for the production of such luminescent material, especially such particulate luminescent material.

Here, amongst others a macro porous silica or alumina particle that is filled with for instance a curable QD-polymer resin mixture is proposed. After filling (the pores of the macro porous silica or alumina (or other porous material), the QD/polymer/macro porous silica composite particles can for instance be encapsulated with silica, alumina, or other sealant (or a (multi-layer) combination of two or more of these). The problem of differences in thermal expansion coefficient may largely be solved. Alternative or additional advantages may be that there is no need to first create micro beads of the QD/host material, with its concomitant difficulties and disadvantages. Instead, one may make use of prefabricated available porous particles. Further, the adherence of an inorganic coating to the inorganic micro particle may substantially be better as compared to the combination of an organic micro bead with inorganic sealant. The thermal expansion coefficient (CTE) mismatch between the inorganic coating and an organic particle may be large whereas in the present invention the thermal mismatch may be small (or even substantially zero). In addition, the final composite particle may be substantially non-scattering due to refractive index matching of polymer and silica, and the final matrix, such as a (silicone) resin, in which the composite particles may be dispersed. Further, knowing that seals are not always perfect, it is advantageous that there may be a certain tolerance for pinholes in the seal, because—in principle— only the pores of the silica particles need to be sealed. The resulting sealed composite particles can hence be processed in air, and mixed with for example optical grade silicones for final application to the LED.

Alternatively, the filled and cured macro porous particles are used as such (i.e. without secondary encapsulation) by mixing them directly in a silicone or other suitable host material for LED applications. Stability and miscibility of QDs is found to be highly dependent on the exact formulation of the first host. However, this first dedicated host may not be the preferred host material for LED applications, for example because of processing conditions, costs, or stability. Therefore, the macro porous silica particles (PSP's) filled with the preferred QD-host material (e.g. an acrylate), can be mixed with the preferred LED host material (e.g. a silicone). Mixing of silica particles in e.g. silicones is well known and used in the field already.

Finally, the filled and cured macro porous particles can be used as such (i.e. without secondary encapsulate) by mixing them directly in a hermetic second host material, e.g. a semi-hermetic epoxy, or hermetic (low melting) glass, etc. In contrast, as indicated above mixing of QDs directly into such host materials was found to be difficult in view of flocculation, non-miscibility, and poor stability.

Therefore, in a first aspect the invention provides a process for the production of a (particulate) luminescent material comprising particles, especially substantially spherical particles, having a porous inorganic material core with pores, especially macro pores, which are at least partly filled with a polymeric material with luminescent nanoparticles, especially quantum dots, embedded therein, wherein the process comprises (i) impregnating the particles of a particulate porous inorganic material with pores with a first liquid ("ink") comprising the luminescent nanoparticles, especially quantum dots, and a curable or polymerizable precursor of the polymeric material, to provide pores that are at least partly filled with said luminescent nanoparticles, especially quantum dots, and curable or polymerizable precursor; and (ii) curing or polymerizing the curable or polymerizable precursor within pores of the porous material. In a specific embodiment, the process further comprises (iii) applying an encapsulation (such as coating, or embedding in a matrix, or both) to the thus obtained particles (with pores that are at least partly filled with a polymeric material with luminescent nanoparticles, especially quantum dots, embedded therein). In this way the particles may be at least partly be coated, or especially even be entirely be coated (i.e. especially a conformal coating).

In a further aspect, the invention also provides a (particulate) luminescent material or a solid matrix comprising such (particulate) luminescent material, obtainable by the process of the invention. Hence, the invention also provides a (particulate) luminescent material comprising particles having a porous inorganic material core with pores which are at least partly filled with polymeric material with luminescent nanoparticles, especially quantum dots, embedded therein. Further, the invention also provides a wavelength converter comprising a light transmissive solid matrix with the (particulate) luminescent material (as defined herein, and/or obtainable according to the process defined herein) embedded therein.

The invention is further described with reference to quantum dots as specific embodiment of (luminescent) nanoparticles.

In yet a further aspect, the invention also provides a lighting device comprising (i) a light source configured to generate light source light, (ii) the (particulate) luminescent material as defined herein or obtainable by the process as defined herein, wherein the (particulate) luminescent material is configured to convert at least part of the light source light into visible luminescent quantum dot light. As indicated above, the (particulate) luminescent material may be embedded in a light transmissive solid matrix.

With the above described invention, advantageously a well processable QD-based luminescent material may be provided, for instance as particulate luminescent material. With the invention, the QD may be well shielded from the environment, thereby contributing to the lifetime of the QDs.

Further, in embodiments the (macro porous) particles are at least partly, especially substantially entirely, enclosed by the encapsulation. The encapsulation may be a (multi) layer (coating), but may also comprise a (solid matrix), see also below. Such encapsulation may even further improve lifetime. Especially, an encapsulation comprising an inorganic material, even more especially such inorganic material having a coefficient of thermal expansion (CTE) having a value which is identical to the CTE of the inorganic material of the core, or only differing with a factor within a range of 1/5-5, especially 1/3-3, such as 2/3-3/2 of the CTE value of the inorganic material of the core, may be advantageous in view of life time. The smaller the difference between the CTE of the inorganic core material and the (inorganic) coating material, the smaller the mismatch, and the longer the lifetime of the (particulate) luminescent material may be. Also, a more spherical shape of the particle will reduce the chance on fractures. Residual voids in the macro porous particle (small volumes not filled with the polymeric material containing the QDs) may assist in preventing cracks in the encapsulating coating as they provide a volume into which the polymeric material can expand without exerting force on the matrix material or on the encapsulation.

The inorganic host or core material is not necessarily encapsulated with an inorganic material, such as in the form of a coating or matrix, but the inorganic host may also be encapsulated with an organic material (organic coating or matrix). Hence, in general the first layer of material—if available—encapsulating the porous inorganic material core has a CTE differing with the CTE of the porous inorganic material core with a factor within a range of 1/5-5, especially 1/3-3, such as 2/3-3/2. For instance, the core may be of alumina and the encapsulation may be alumina, or an epoxy or acrylate with a low CTE. Hence, in some embodiments the process further comprises applying an encapsulation to the particles obtained after curing or polymerizing. Likewise, the invention thus also provides a particulate luminescent material wherein the particles comprise an encapsulation encapsulating at least part of the particle (i.e. the core is at least partially encapsulated). Especially, the encapsulation comprises an inorganic coating, even more especially the encapsulation comprises a coating which comprises at least a layer in direct physical contact with the core, wherein this layer essentially consists of an inorganic material, and even more especially consists of the same inorganic material as the core. Hence, the (particulate) inorganic host especially comprises a porous silica, a porous alumina, a porous glass, a porous zirconia ($ZrO2$), or a porous titania, and the coating (at least) comprises silica coating, an alumina coating, a glass coating (same type of glass), a zirconia coating, or a titania coating, respectively.

In case the particles are not coated, the particles in fact are the porous cores per se. Hence, the term "core" or "porous core" especially refers herein to the porous particle, not (yet) coated or encapsulated, or not (yet) coated and encapsulated. A coating may especially enclose at least 50%, even more at least 80%, yet even more especially at least 95%, such as 100% of the entire outer surface area (A) of the particle. Hence, the particles may be entirely enclosed by a shell. The term shell does not necessarily refer to spherical shells; the shell may also be non-spherical (see also below).

Here, the encapsulation may relate to a coating, such as a single layer coating or a multi-layer coating. Such coating encloses at least part of the particle, especially the entire particle (i.e. a shell enclosing the core). In this way, the quantum dots are substantially shielded from the environment in a first line of protection by the polymeric host material, and by a second line of protection by the encapsulation that may form a shell around the entire core. The cores may be spherical, but are not necessarily spherical. Hence, the shell may also not necessarily be spherical. For instance, the macro porous particle filled with the QD in host material may be egg-like shaped, and the shell may thus have the shape of an eggshell.

Especially, the coating comprises an inorganic material. In embodiments, the coating consists of inorganic material. In specific embodiments, the process comprises providing the encapsulation by (at least partly) coating the particles with an inorganic coating, typically a metaloxide coating, such as selected from the group consisting of a silicon containing oxide, an aluminum containing oxide, a zirconium containing oxide, a glass, a titanium containing oxide, a hafnium containing oxide and an yttrium containing oxide.

Here, the term "silicon containing oxide" may relate to the class of silicon containing oxides, such as silicates, like $SiO4$4-group containing oxides, $SiO3$2-group containing oxides, $Si4O10$4-containing oxides, etc., but especially also $SiO2$ (silica). Examples are e.g. $Mg2SiO4$, $Mg3(OH)2Si4O10$, and thus $SiO2$. The term "aluminum containing oxide" may relate to the class of aluminum containing oxides, such as aluminates, like $MgAl2O4$, $BaMgAl10O17$, $Y3Al5O12$, and especially $Al2O3$. The term "titanium containing oxide" may relate to the class of titanium containing oxides, such as titanates, like $Ba2TiO4$, $CaTiO3$, but also $Li2TiO3$, and especially $TiO2$. In other embodiments, the inorganic coating is selected from the group consisting of indium metal oxide coatings, such as selected from the group consisting of an indium tin oxide (ITO) coating, and an indium zinc oxide coating may be applied. In yet other embodiments, the coating comprises an inorganic coating selected from the group consisting of a zirconia coating ($ZrO2$) and a tin oxide ($SnO2$) (SNO) coating. Especially, the coating (as embodiment of an encapsulation) is selected from one or more of the group of silica, alumina, ITO, and SNO. Combinations of such materials, or multi-layer coatings comprising layers with different compositions, such as described above, may also be applied. Examples of glasses are e.g. borate glasses, phosphate glasses, borosilicate glasses, etc.

Alternatively or addition, also an organic coating may be applied, such as a Parylene coating ((chemical vapor deposited) poly(p-xylylene) polymer coating) or a poly vinyl alcohol (PVA) coating, etc.

The coating may comprise a single layer coating, or a multi-layer coating. The multi-layer coating may comprise a plurality of different layers, stacked to each other. In embodiments, one or more of such layers are inorganic materials layers. Alternatively or additionally, in embodiments, one or more of such layers are organic materials layers. In a specific embodiment, a first layer comprises an organic (material) layer, which may be relatively easily applied to the particles, and a second layer, more remote from the core, comprises an inorganic (material) layer. Especially, inorganic material layers are applied, as these may give the best hermetic encapsulation and as these may give the best CTE match. The coating(s) may amongst others be applied in a gas phase process, for instance using a fluidic bed reactor. In a specific embodiment, the process comprises providing the encapsulation by (at least partly) (multi-layer) coating the particles in a gas phase process, especially in a fluid bed reactor, by atomic layer deposition (ALD). As known in the art, atomic layer deposition is a thin film deposition technique that is especially based on the sequential use of a gas phase chemical process. The majority of ALD reactions use two chemicals, typically called precursors. These precursors react with a surface one at a time in a sequential, self-limiting, manner. Especially by exposing the precursors to the growth surface repeatedly, a thin film is deposited. Several ALD methods are known in the art, such as plasma enhanced ALD or thermally assisted ALD. An example of a suitable process is describes in WO2010100235A1, which is herein incorporated by reference. However, also other coating methods than ALD may be applied. Powder ALD is known in the art.

Wet-chemical growth of a metal oxide coating such as a silica coating may be achieved by for example sol-gel chemistry or alternative precipitation methods. The inorganic surface of the metaloxide particle is a suitable starting point for further growth of a metaloxide shell by sol-gel chemistry. For instance, a silica coating around a porous silica particle can be achieved by addition of a silica precursor such as TEOS (Tetraethyl orthosilicate) in a water medium (can be done in both acidic and basic environment), also referred to as the Stöber process. Preferably, the chemical growth of the inorganic encapsulation layer is performed in a non-aqueous medium. In other instances it may be desired to first provide an organic coating layer to the particle (first coating), and then applying the wet chemical grown metal oxide coating(s) to prevent QDs to be exposed to water.

However, other coating process for coating particles may also be applied, such as e.g. described in WO2010/100235. Chemical vapor deposition and/or atomic layer deposition may amongst others be applied to provide the (multi-layer) coating.

Hence, in specific embodiments, the invention also provides applying an encapsulation to the particles obtained after curing or polymerizing, wherein the process comprises providing the encapsulation by multi-layer coating the particles, especially in a gas phase process, especially using a fluidic bed reactor, wherein the thus obtained multi-layer coating comprises a first coating layer in contact with the core, wherein the first coating layer comprises in a specific embodiment an organic polymer coating, and wherein the multi-coating comprises a second coating layer, relative to the first coating layer more remote from the core, and wherein the second coating layer comprises an inorganic coating. Hence, the invention also provides a particulate luminescent material comprising particles having a porous inorganic material core with pores which are at least partly filled with polymeric material with luminescent quantum dots embedded therein, wherein the cores are encapsulated with a coating, especially a multi-layer coating.

In an alternative embodiment, the thus obtained multi-layer coating comprises a first coating layer in contact with the core, wherein the first coating layer comprises in a specific embodiment an inorganic coating, and wherein the multi-coating comprises a second coating layer, relative to the first coating layer more remote from the core, and wherein the second coating layer comprises an organic polymer coating. An advantage thereof may be that the application of an inorganic coating to the particle (core) may be relatively easy due the chemistry match. This may especially be the case when the inorganic material core has the same lattice constant and/or substantially consists of the same elements as the coating. Hence, when an inorganic coating is applied, the inorganic material core may be used as basis to grow the inorganic coating material on. As indicated above, especially the first coating layer is in contact with the core over at least 50% of the surface area of the core, even more especially at least at least 95%, such as 100% of the entire outer surface area (A) of the particle (or core).

Therefore, in an embodiment the thus obtained multi-layer coating comprises an organic polymer coating and an inorganic coating. The multi-layer coating may thus comprise one or more inorganic coatings (i.e. coating layers) and one or more organic coatings (i.e. coating layers), which may optionally alternate and form a stack of alternating inorganic and organic layers.

The (multi-layer) coating may especially have a thickness in the range of 10 nm-10 μm, such as especially 50 nm-2 μm. In general, the coating thickness is smaller than the particle diameter.

With the coating process, particles are obtained comprising a core and a shell. The shell may have a thickness of at least 10 nm, like at least 50 nm (see above). The shell may especially comprise an inorganic layer. The core comprises the luminescent nano particles. However the shell does substantially not comprise such particles. Hence, porous inorganic particles may be provided, with luminescent nanoparticles in the pores, and with the porous particle enclose by a shell which does (substantially) not comprise such luminescent nanoparticles. Especially, the thickness of the shell is at least 10 nm. Such particles may however be embedded in a matrix, see also below.

Alternatively, or also additionally, the invention also provides the (particulate) luminescent material embedded in a matrix (a further embodiment of an encapsulation). Such matrix is especially a body or layer, such as a self-supporting layer, wherein within the matrix a plurality of the particles (with inorganic (porous) cores and luminescent nano particles within the pores) is available. For instance, these particles may be dispersed therein. Such matrix may be a waveguide or have wave guiding properties (see also below). Hence, in a further aspect the invention also provides a process wherein the process (further) comprises providing the encapsulation by embedding the particles in a light transmissive (solid) matrix. Also, the invention thus provides a wavelength converter comprising a light transmissive (solid) matrix with the particulate luminescent material. The matrix may comprises one or more materials selected from the group consisting of a transmissive organic material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone (such as especially polymethylphenylsilicone), polyvinylchloride (PVC), polyvinyl alcohol (PVA), polyethyleneterephthalate (PET), (PETG) (glycol modified polyethylene terephthalate), PDMS (polydimethylsiloxane), and COC (cyclo olefin copolymer). However, in another embodiment the matrix (material) may comprise an inorganic material. Preferred inorganic materials are selected from the group consisting of (low melting) glasses, (fused) quartz, and transmissive ceramic materials. Also hybrid materials, comprising both inorganic and organic parts may be applied. Especially preferred are silicones, PMMA, epoxies, PET, transparent PC, or glass as material for the matrix (material). Note that the above mentioned one or more materials selected from the group consisting of a transmissive organic material support may also be applied as polymeric material with luminescent quantum dots in the pores. Hence, a precursor for such material may also be applied as curable or polymerizeble precursor (for the polymeric material wherein the quantum dots may be embedded in the pores of the inorganic cores).

When the matrix comprises a polymeric matrix, the polymeric matrix may especially substantially be identical to the polymeric material in the pores wherein the quantum dots are embedded.

However, in another embodiment, the polymeric matrix may be produced, in the presence of the particulate luminescent material, with a curable or polymerizable precursor that may be substantially different to the curable or polymerizable precursor that is used to cure or polymerize within the pores of the porous material (see further also below). Hence, a larger freedom of choice of materials for the polymeric matrix is possible with the present invention.

Especially, the (particulate) luminescent material is enclosed by an encapsulate or encapsulation. As used herein, "encapsulation" may amongst others refer to protection against a particular element or compound, for example, oxygen (O2) (such as in the form of air) and/or water. In an embodiment, encapsulation can be complete (also referred to herein as full encapsulation). Especially, in an embodiment the particulate luminescent material is at least partially encapsulated by a material that is substantially impervious to oxygen. In an embodiment, the particulate luminescent material is at least partially encapsulated by a material that is substantially impervious to moisture (e.g. water). In an embodiment, the particulate luminescent material is at least partially encapsulated by a material that is substantially impervious to air. In an embodiment, the particulate luminescent material is at least partially encapsulated by a material that is substantially impervious to oxygen and moisture. In another embodiment, the particulate luminescent material is entirely encapsulated by a material that is substantially impervious to one or more of oxygen and moisture. As indicated above, especially an encapsulate at least comprising an inorganic coating may be beneficial for such protection.

As will be clear to a person skilled in the art, a combination of two or more encapsulations may be possible, such as a particulate luminescent material with particles encapsulated with a coating (such as a multi-layer coating), which are embedded in a matrix. Hence, the process may also comprises one or more of (i) providing the encapsulation (to the particulate luminescent material) by embedding the particles in a light transmissive solid matrix, and (ii) providing the encapsulation by (at least partly) coating the particles and subsequently embedding the particles in a light transmissive solid matrix.

At least part of the encapsulation is transmissive for light, especially in the visible, and will thereby allow excitation light reach the wavelength converter nano particles and allow emission light therefrom (at least in the visible) escape from the encapsulated wavelength converter. Especially, the encapsulation, such as the matrix material, is transmissive for light having a wavelength selected from the range of 380-750 nm. For instance, the matrix material may be transmissive for blue, and/or green, and/or red light. Especially, the encapsulation, such as the matrix material is transmissive for at least the entire range of 420-680 nm. Especially, the encapsulation, such as the matrix material may have a light transmission in the range of 50-100%, especially in the range of 70-100%, for light generated by the light source of the lighting unit (see also below) and having a wavelength selected from the visible wavelength range. In this way, the encapsulation, such as the matrix material is transmissive for visible light from the lighting unit. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The wavelength converter may be transparent or translucent, but may especially be transparent. When the wavelength converter is transmissive, light of the light source may not entirely be absorbed by the wavelength converter. Especially when using blue light, this may be of interest, as the blue light may be used to excite the light luminescent materials and may be used to provide a blue component (in white light).

Hence, the invention also provides a wavelength converter comprising a light transmissive solid matrix with the (particulate) luminescent material as defined herein, or obtainable according to the process as defined herein, embedded therein.

The term "particulate" luminescent material relates to a luminescent material comprising particles. The particles in this invention will comprise an inorganic host, which will in generally not be designed to be luminescent, though this is not excluded. The host comprises pores, which are, at least partly, filled with polymeric material. The polymeric material contains nano particles, especially QDs, embedded therein. Hence, the pores comprise QDs, which may not only be at the surface of the pores, but which may mainly be distributed over the polymer within the pore. The particulate luminescent material is herein also indicated as "composite particles".

As indicated above, the inorganic host particles after impregnation with the quantum dots and after curing and/or polymerization may be used as such. In such instance, the particles have no coating. However, also in these embodiments the term "core" is applied, though the particle may entirely consist of such core. Optionally the particles are encapsulated. This may be a coating, i.e. in principle each particle may include a coating around the core: core-coating particles. However, the particles may also be embedded in a matrix, such as a film or body: such matrix encapsulates a plurality of the (optionally coated) cores. In each of these embodiments and variants, the pores of the cores enclose quantum dots.

The (particulate) inorganic host especially comprises a porous silica, a porous alumina, a porous glass, a porous zirconia ($ZrO_2$), and a porous titania. In yet another embodiment, the (particulate) inorganic host especially comprises silicon carbide (SiC), hydrotalcite, steatite (soapstone), cordierite (a magnesium iron aluminum cyclosilicate), and niobia (diniobium pentoxide). Hence, in yet another embodiment, the (particulate) inorganic host comprises a porous glass. Examples of glasses are e.g. borate glasses, phosphate glasses, borosilicate glasses, etc. Examples of porous glasses are e.g. Vycor® glasses, such as e.g. porous glass 7930, though other porous glasses may also be applied.

Note that in an embodiment the particles of a particulate porous inorganic material, i.e. the inorganic host may include a combination of different type of particles. This may include one or more of different type of particle sizes, like bi-modal or poly-modal particle size distributions and chemically different types of particles, like a combination of porous silica and porous alumina.

The pore sizes are especially in the range of 0.05-50 µm, such as in the range of 0.1-10 µm. The pore sizes can especially be defined as the dimensions of the pore perpendicular to a pore axis. For instance, the pore size may be the width or height or diameter. Pore sizes may especially be determined mercury intrusion porosimetry (especially for larger pores) and gas absorption/desorption (for smaller pores), as known to the person skilled in the art. Pores can have various shapes such as channels, inkpots and slits. Pores may be interconnected. The mean pore sizes are especially in the range of 0.05-50 µm, such as in the range of 0.1-10 µm.

Further, the particle sizes may in general be in the range of 0.5-800 µm, such as 1-500 µm, especially in the range of 2-20 µm, like 2-10 µm. Here, the particle size especially refers to the number averaged particle size, such as for instance may be derived with SEM analysis and optically estimating the particle sizes, or with a Malvern particle size analyzer or other laser based particle size analysis. Particle size may also be derived from microscope measurements, such as with SEM. Especially, the mean particle sizes may in general be in the range of 0.5-800 µm, such as 1-500 µm, especially in the range of 2-20 µm, like 2-10 µm. Hence, the particles are herein also indicated as micro particles.

As will be clear to a person skilled in the art, the pore sizes will (in general) be smaller than the particle sizes. In general, also the mean pore sizes are smaller than the mean particle sizes. With the present invention, it is possible for the first time to provide a quantum dot based micro particulate material with good lighting properties. Hence, the present luminescent material may be used in conventional processes like processing in a luminescent layer on a LED die or dispersing in a matrix of a LED dome or including in a coating material for a luminescent coating (like in a fluorescent lamp).

Especially, the porous inorganic particles are rounded particles, especially well rounded particles, such as substantially spherical particles. This may be advantageous in view of processing of the particles, such as when coating a paste comprising the particle on a transmissive window of a lighting device such as a T8 tube (commonly known to a person skilled in the art of lighting). Further, the rounded shape of the porous inorganic particles may also facilitate formation of a complete and uniform coating therein (if applicable) and reduce the chance on crack-formation at the particle/coating interface Especially, the number averaged circularity is larger than 0.92, especially larger than 0.95, such as at least 0.98. Here, the circularity is defined as $4\pi A/P^2$, wherein A is the surface area of the particle (assuming the pores to be closed), and P its perimeter. Circularity is a ratio of the perimeter of a circle with the same area as the particle. Hence, very well processable luminescent particles may be created based on well-defined porous particles, like porous silica particles.

In a specific embodiment, the porous inorganic material comprises one or more of the above described materials, such as one or more of a porous silica, a porous alumina, a porous glass, a porous zirconia, and a porous titania, the pores have mean pore sizes (dp) in the range of 0.1-10 μm, and the precursor comprises a curable acrylate. Especially acrylates, but also silicones, may work well to embed the QDs in.

The porous inorganic material or the cores, before filling and before applying an optional coating, may include an outer layer comprising filling openings. The particles may e.g. comprise an outer layer that comprises the same material as the core material, but is more densified and/or the outer layer may comprise a coating. Such coating may block part of the pores. In embodiments wherein such coating blocks part of the pores, the coating will also comprise filling holes. The total area of the filing holes in the outer layer or coating may include 5-95% of the total outer surface area (A) of the core, such as 20-80% of the area. Such porous inorganic particles with an outer layer are commercially available as Trisoperl particles from Vitrabio-Biosearch/VitraBio GmbH.

Therefore, especially the invention also provides a luminescent material as defined herein, wherein the particles comprise an encapsulation encapsulating at least part of the core, wherein the porous inorganic material comprises one or more of a porous silica, a porous alumina, a porous glass, a porous zirconia, and a porous titania, wherein the pores have mean pore sizes (dp) in the range of 0.1-10 μm, and wherein the polymeric material especially comprises one or more of an acrylate, silicone, or epoxy type polymer (or a silicone type polymer), and wherein the encapsulation especially comprises an inorganic coating. As indicated above, an inorganic coating in combination with the inorganic core may have advantages with respect to CTE match, though suitable organic coatings in view of CTE may also be found. Further, such inorganic coating may relatively be easily applied on the core. In addition, as indicated above, the inorganic coating may be relatively impervious for water and/or gas. Optionally, also an organic coating in combination with the inorganic core may be applied, especially when the CTE difference is smaller than a factor in the range of 1/5-5 (i.e. CTE of inorganic core material divided by the CTE of the coating material is in the range of 1/5-5).

These pores are at least partly filled with the first liquid (curable ink). Especially, the pores may substantially be filled with the first liquid. Impregnation may be applied in conformance with the incipient wetness technique. Alternatively (or additionally), after impregnation the impregnated particles and remaining first liquid are separated from each other. However, in the case of incipient wetness, the remaining first liquid may be substantially zero, as in incipient wetness technique, the volume of the first liquid will be chosen to be substantially equal to the pore volume. Hence, in embodiments impregnation is applied in conformance with the incipient wetness technique or after impregnation the impregnated particles and remaining first liquid are separated from each other.

In a further embodiment, before impregnation the particles are subjected to a sub atmospheric pressure. This may facilitate penetration of the precursor (liquid) with QDs into the pores. By the sub atmospheric pressure, gas is removed to make the filling more complete. Alternatively or additionally, the pores of the porous inorganic material are hydrophobized. For instance, the pores may be coated with a silane. A method for hydrophobizing the inner pore surfaces is e.g. through the application of hydrophobic silane monolayers. These monolayers consist of a reactive inorganic head group that binds covalently to the (siliceous) surface and an organic tail that self-organizes to form a dense network of hydrocarbon chains. Because these coatings are only one monolayer thick, their dimensions are no more than a few nm in thickness, such as e.g. less than 10 nm. Alternatively or additionally, a Teflon coating may be applied. Alternatively or additionally, the impregnation may be (further) facilitated by subjecting the particles while and/or after having contacted with the precursor (liquid) with QDs to an elevated pressure, such as 1.2 bar or higher.

As indicated above, the polymeric material that hosts the QDs may be obtained by curing or polymerizing the curable or polymerizable precursors within the pores of the porous material. Hence, having introduced the curable precursor, curing may be started. Alternatively (or additionally), having introduced polymerizable precursor, polymerization may be started.

The liquid may thus comprise the luminescent quantum dots and a curable or polymerizeble precursor. The liquid is thus (in general) not a solvent, but may in embodiments essentially consist of the luminescent quantum dots and a curable or polymerizeble precursor and optionally other materials, wherein the optionally other materials are especially selected from the group consisting of a particulate material and an inorganic material, such as a particulate inorganic materials, like a scattering material or an inorganic particulate luminescent material. The optional other material may in embodiments also comprise a dye (see further also below). In some fields, polymerization is also considered curing. Here, curing especially refers to cross-linking.

For instance, the polymerizable precursor may comprise polymerizable monomers. In such instance, the polymeric material hosting the QDs within the pores is based on radical polymerizable monomers. The phrase "wherein the polymeric (host) material is based on radical polymerizable monomers", may especially indicate that the polymer host material is obtainable by reaction monomers that are able to form polymers by radical polymerization. A non-limiting number of examples of such polymers are mentioned below, and the person skilled in the art may derive therefrom which monomers (i.e. monomer precursors) may be used (see further also below). Such monomer thus especially includes one or more radical-polamerizable groups (which may be used for polymeriation with a photo initiator upon irradiation). Such monomers may in an embodiment include different type of monomers. Especially, the radical polymerizable monomers are selected from the group consisting of a vinyl monomer, an acrylate monomer, and a combination of a thiol and a diene.

As can for instance be derived from WO 03/093328, examples of monomers polymerizable by a free radical polymerization process include, but are not limited to, alpha-olefins; dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifluoroethylene, N-(3-dimethylaminopropyl methacrylamide, dimethylaminopropyl methacrylamide, acrylamide, methacrylamide, and similar derivatives; acrylic acids and derivatives for example, acrylic acid, methacrylic acid, crotonic acid, acrylonitrile, acrylic esters substituted with methoxy, ethoxy, propoxy, butoxy, and similar derivatives for example, methyl acrylate, propyl acrylate, butyl acrylate, methyl methacrylate, methyl crotonate, glycidyl methacrylate, alkyl crotonates, and related esters; cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2,3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like; and mixtures thereof.

As can be derived from e.g. WO 2011/031871, additional examples of monomers include, but are not limited to, allyl methacrylate, benzyl methyl acrylate, 1,3-butanediol dimethacrylate, 1,4-butanediol dimethacrylate, butyl acrylate, n-butyl methacrylate, ethyl methacrylate, 2-ethyl hexyl acrylate, 1,6-hexanediol dimethacrylate, Bisphenol A ethoxylate diacrylate, 4-hydroxybutyl acrylate, hydroxyethyl acrylate, 2-hydroxyethyl methacrylate, 2-hydroxypropyl acrylate, isobutyl methacrylate, lauryl methacrylate, methacrylic acid, methyl acrylate, 2,2,3,3,4,4,5,5-octafluoropentyl acrylate, pentaerythritol triacrylate, 2,2,2-trifluoroethyl 2-methyl acrylate, trimethylolpropane triacrylate, acrylamide n,n,-methylene-bisacryl-amide phenyl acrylate, and divinyl benzene.

Many of these types of monomers are acrylate systems. Hence, the term "acrylate" may refer to any of those above mentioned systems such as acrylate, meth(yl)acrylate, butyl acrylate, lauryl methacrylate, etc. etc. Likewise, vinyl monomer may refer to any monomer comprising a vinyl group.

The phrase "wherein the polymeric (host) material is based on radical polymerizable monomers" does not exclude the presence of e.g. cross-linkers in the monomeric starting material. For the synthesis of the wavelength converter, see below. In principle, the polymer obtained may be any polymer, such as a linear polymer, a (hyper)branched polymer, a cross-linked polymer, a star polymer, a dendrimer, a random copolymer, an alternating copolymer, a graft copolymer, a block copolymer, and a terpolymer. The polymeric (host) material may in an embodiment be or comprise a resin.

Especially those radical polymerizable monomers are applied, which lead to a light transmissive polymer. In the embodiment of the invention, the (light transmissive polymer) is a polymer which shows high light transmission. Preferably a mean absorption of less than 5%/mm more preferentially less than 2%/mm, especially less than 1%/mm (per mm polymer thickness) in the wavelength region 400-700 nm. Hence, in an embodiment the first polymer is a polymer having an absorption of less than 5%/mm, more preferentially less than 2%/mm and most preferentially less than 1%/mm in the wavelength range of 400-700 nm. Note that the transmission and absorption of the polymer is related to the polymer per se, i.e. the polymeric (host) material, and not to the transmission of the wavelength converter (i.e. including the wavelength converter nanoparticles). Especially, the maximum absorption (of the polymer) is less than 20%/mm, even more especially less than 10%/mm, over the entire wavelength region 400-700 nm. Transmission (T) and absorption (A) relate as $A=1-To/Ti$, wherein Ti is the intensity of the visible light impinging on the item (such as the polymer or the converter) and To being is the intensity of the light escaping at the other side of the item. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

As can e.g. be derived from WO 2011/031871, examples of polymers, for example and without limitation, are polyethylene, polypropylene, polystyrene, polyethylene oxide, polysiloxane, polyphenylene, polythiophene, poly(phenylene-vinylene), polysilane, polyethylene terephthalate and poly(phenylene-ethynylene), polymethylmethacrylate, polylaurylmethacrylate, polycarbonate, epoxy, and other epoxies. Similar as what has been said with respect to monomers, some of these types of polymers are acrylate systems. Hence, the term "polyacrylate" may refer to any of those above mentioned systems such as polyacrylate, polymeth(yl)acrylate, polybutyl acrylate, polylauryl methacrylate, etc. etc. Likewise, vinylpolymer may refer to any polymer based on monomers comprising a vinyl group, such as polyethylene, polyprolylene, etc. etc.

In view of light transmission and/or chemical stability and/or production process considerations, especially the polymeric (host) material is selected from the group consisting of a poly vinyl polymer (such as a poly ethylene, a poly propylene, etc.), a poly acrylate polymer (such as a poly acrylate, a poly methacrylate, a poly laurylmethacrylate, etc.) and a thiol-ene polymer (such as polythiophene).

The term "radical initiator based material" refers to the remains of the radical initiator that can be found or evaluation from the composition of the polymeric (host) material. This radical initiator based material may include unreacted radical initiator, but also radical initiator that has been reacted. In case radical initiator has been consumed, it refers to groups in the polymeric (host) material that originate from the radical initiator. The term "radical initiator" may in an embodiment refer to a plurality of different radical initiators.

The free radical polymerization process is well known and involves a reaction initiated by the formation of a free radical from a free radical generator, for example a peroxide or azo initiator. A reaction is initiated by addition of the free radical to an unsaturated monomer molecule that subsequently adds, in a step-wise manner, to additional unsaturated monomers to form a growing chain or polymer.

As can e.g. be derived from WO 03/093328, examples of free radical initiators include, but are not limited to, the following: organic peroxides like: t-alkyl peroxyesters, tert-butyl peroxybenzoate, tert-butyl peroxyacetate, ter-butyl peroxypivalate, tert-butyl peroxymaleate, monoperoxycarbonates, OO-tert-butyl O-isopropyl monoperoxycarbonate, diperoxyketals, ethyl 3,3-di-(tert-amylperoxy)-butyrate, n-butyl-4,4-di(tertbutylperoxy)-valerate, 1,1-di(tert-butylperoxy)-cyclohexane, 1,1-di(tert-amylperoxy)-cyclohexane, dialkyl peroxides, 2,5-di(tert-butylperoxy)-2,5-dimethyl-3-hexyne, 2,5-di(tert-butylperoxy)-2,5-dimethylhexane, di-tert-amyl peroxide, di-tert-butyl peroxide, dicumyl peroxide, t-alkyl hydroperoxides, tert-butyl hydroperoxide, ter-amyl hydroperoxide, alpha-cumyl hydroperoxide, ketone peroxides, methyl ethyl ketone peroxide, cyclohexanone peroxide, 2,4-pentanedione peroxide, isobutyryl peroxide, isopropyl peroxydicarbonate, di-n-butyl peroxydicarbonate, di-sec-butyl peroxydicarbonate, tert-butyl perneodecanoate, dioctanoyl peroxide, didecanoyl peroxide, diproprionyl peroxide, didecanoyl peroxide, dipropionyl peroxide, dilauroyl peroxide, tert-butyl perisobutyrate, tert-butyl peracetate, tert-butyl per-,5,5-trimethyl hexanoate; azo compounds like: 2,2'-azobis[4-methoxy-2,4-dimethyl]pentanenitrile, 2,3'-azobis[2,4-dimethyl]pentanenitrile, 2,2'-azobis[isobutyronitrile]; carbon-carbon initiators like: 2,3-dimethyl-2,3-diphenylbutane, 3,4-dimethyl-3,4-diphenylhexane, 1,1,2,2-tetraphenyl-1,2-bis(trimethylsiloxy)ethane; inorganic peroxides like: hydrogen peroxide, potassium peroxydisulfate; photoinitiators like: benzophenone 4-phenylbenzophenone, xanthone thioxanthone, 2-chlorothioxanthone, 4,4'-bis (N,N'-dimethylamino benzophenone), benzyl, 9,10-phenanthraquinone, 9,10-anthraquinone, alpha,alpha-dimethyl-alpha-hydroxyacetophenone, (1-hydroxycyclohexyl)-phenylmethanone, benzoin ethers, like methyl, ethyl, isobutyl, benzoin ethers, alpha,alpha-dimethoxy-alpha-phenylacetophenone, 1-phenyl-1,2-propanedione, 2-(O-benzoyl)oxime, diphenyl(2,4,6-trimethylbenzoyl)phosphineoxide, alpha-dimethylamino-alpha-ethyl-alpha-benzyl-3,5-dimethyl-4-morpholinoacetophenone, etc.

As can for instance be derived from WO 2011/031871, there are in general two classes of photoinitiators. In the first class, the chemical undergoes unimolecular bond cleavage to yield free radicals. Examples of such photoinitiators include benzoin ethers, benzyl ketals, a-dialkoxy-acetophenones, a-amino-alkylphenones, and acylphosphine oxides. The second class of photoinitiators is characterized by a bimolecular reaction where the photo initiator reacts with a co-initiator to form free radicals. Examples of such are benzophenones/amines, thioxanthones/amines, and titanocenes (visible light). A non-exhaustive listing of specific examples of photoinitiators that may be useful with a photo-polymerizable monomer for particle preparation include the following from CIBA: IRGACURE 184 (1-hydroxy-cyclohexyl-phenyl-ketone), DAROCUR 1173 (2-hydroxy-2-methyl-1-phenyl-1-propanone), IRGACURE 2959 (2-hydroxy-1-[4-(2-hydroxyethoxy)phenyl]-2-methyl-1-propanone), DAROCUR MBF (Methylbenzoylformate), IRGACURE 754 (oxy-phenyl-acetic acid 2-[2 oxo-2 phenyl-acetoxy-ethoxy]-ethyl ester and oxy-phenyl-acetic 2-[2-hydroxy-ethoxy]-ethyl ester), IRGACURE 651 Alpha, (alpha-dimethoxy-alpha-phenylacetophenone), IRGACURE 369 (2-Benzyl-2-(dimethylamino)-1-[4-(4-morpholinyl) phenyl]-1-butanone), IRGACURE 907 (2-methyl-1-[4-(methylthio)phenyl]-2-(4-morpholinyl)-1-propanone), DAROCUR TPO (diphenyl(2,4,6-trimethylbenzoyl)phosphine oxide), IRGACURE 819 (phosphine oxide, phenyl bis(BAPO) (2,4,6-trimethyl benzoyl)), IRGACURE 784 (bis(eta 5-2,4-cyclopentadien-1-yl)Bis[2,6-difluoro-3-(1H-pyrrol-1-yl)phenyl]titanium), IRGACURE 250 (iodonium, (4-methylphenyl)[4-(2-methylpropyl)phenyl]-hexafluorophosphate(1-).)

An example of a thermal initiator is benzoyl peroxide and azo-isobutyro-nitril (AIBN) (see further also below). In addition to or alternative to such azo initiator, a peroxide initiator can also be used. Further, in addition to or alternative to such initiator, also photo initiators such as α,α-dimethoxy-α-phenylacetophenone can be used.

The polymerization may be started by heating and or irradiating the radical polymerizable polymers, especially may be started by (at least) irradiating the radical polymerizable monomers. Especially, polymerization may be initiated photo chemically upon irradiation with high energetic rays such as UV, X-rays, gamma rays, electrons. If in the substantial absence of radical (photo)initiator the polymerization may be started by (e.g. UV) irradiation of the mixture (including the radical polymerizable monomers). In some cases it may be desirable to heat up the mixture above the glass transition of the system in order to reach complete polymerization. When polymerization starts, the temperature may again be lowered below the glass transition temperature; after termination, the thus obtained wavelength converter may in some embodiments be cooled down below the glass transition temperature. However, also other methods may be applied, as will be clear to the person skilled in the art. Especially, during polymerization the temperature will not be higher than the boiling point of the monomer(s) used.

Preferably, before polymerization starts (substantially), the partial pressure of oxygen over the mixture may substantially be reduced. For instance, the mixture may be provided in a low-oxygen atmosphere, or after providing the mixture but before polymerization, the oxygen partial pressure is lowered. In an embodiment, the polymerization takes place in a low-oxygen environment, like a glove box. Especially, an inert gas may be applied, like one or more of Ar, CO2 or N2. Optionally, polymerization may take place under reduced pressure. Alternatively, the oxygen amount in the gas over the mixture, at least during polymerization, is less than 1 ppm, such as less than 0.2 ppm. Hence, the method may especially comprise polymerizing the radical polymerizeble monomers while maintaining the mixture in an inert gas atmosphere.

An alternative polymer may be a silicone, such as especially polymethyl-iphenyl silicone, PDMS, polysilsesquioxane, or other type of siloxane compounds. Hence, the precursor may also comprise a polymerizeble silicone precursor. For instance, hydrosylisation with a Pt catalyst may be applied. In an embodiment, through the hydrosilation reaction between an ethylenically unsaturated epoxide and an SiH-containing silicone a curable epoxysilicone product can be made. This may be catalyzed by catalyzed by a quaternary ammonium, phosphonium or arsonium hexahaloplatinate.

In a specific embodiment, the precursor comprises a precursor for a siloxane (silicone). Especially, the silicone may be an optical grade commercial (polymerizeble or curable) silicone, as available from e.g. Dow, Shinetsu, or Wacker.

Further, addition polymerization may be an option, e.g. to epoxided or poly urethanes, etc. Other mechanisms for polymerization are UV, thermal, with or without a catalyst, etc.

For instance, the curable precursor may comprise curable polymers. In such instance, the polymeric material hosting the QDs within the pores is based on curable polymers.

For example, a liquid polymer (within the pores) can be turned into a solid or gel by cross-linking the polymer chains together. Examples of liquid polymers that can be cross-linked are for instance described in EP 0246875, wherein mercaptan-terminated liquid polymer with a cross-linking component is cross-linked. In another embodiment, silicones can be cured.

As indicated above, the luminescent material in general comprises particles with within the pores thereof the polymeric material hosting the luminescent quantum dots. The term "quantum dots" or "luminescent quantum dots" may also refer to a combination of different type of quantum dots, i.e. quantum dots that have different spectral properties. The QDs are herein also indicated as "wavelength converter nanoparticles".

The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) CuInS2, CuInSe2, CuGaS2, CuGaSe2, AgInS2, AgInSe2, AgGaS2, and AgGaSe2. In yet a further embodiment, the luminescent nanoparticles may for instance be (core-shell quantum dots, with the core selected from the group consisting of) I-V-VI2 semiconductor quantum dots, such as selected from the group consisting of (core-shell quantum dots, with the core selected from the group consisting of) LiAsSe2, NaAsSe2 and KAsSe2. In yet a further embodiment, the luminescent nanoparticles may for instance be core-shell quantum dots, with the core selected from the group consisting of) group (IV-VI compound semiconductor nano crystals such as SbTe. In a specific embodiment, the luminescent nanoparticles are selected from the group consisting of (core-shell quantum dots, with the core selected from the group consisting of) InP, CuInS2, CuInSe2, CdTe, CdSe, CdSeTe, AgInS2 and AgInSe2. In yet a further embodiment, the luminescent nanoparticles may for instance be one of the group (of core-shell quantum dots, with the core selected from the group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

The luminescent nanoparticles (without coating) may have dimensions in the range of about 2-50 nm, such as 2-20 nm, especially 2-10 nm, even more especially 2-5 nm; especially at least 90% of the nanoparticles have dimension in the indicated ranges, respectively, (i.e. e.g. at least 90% of the nanoparticles have dimensions in the range of 2-50 nm, or especially at least 90% of the nanoparticles have dimensions in the range of 2-5 nm). The term "dimensions" especially relate to one or more of length, width, and diameter, dependent upon the shape of the nanoparticle.

In an embodiments, the wavelength converter nanoparticles have an average particle size in a range from about 1 to about 1000 nanometers (nm), and preferably in a range from about 1 to about 100 nm. In an embodiment, nanoparticles have an average particle size in a range from about 1 to about 20 nm. In an embodiment, nanoparticles have an average particle size in a range from about 1 to about 10 nm.

Typical dots are made of binary alloys such as cadmium selenide, cadmium sulfide, indium arsenide, and indium phosphide. However, dots may also be made from ternary alloys such as cadmium selenide sulfide. These quantum dots can contain as few as 100 to 100,000 atoms within the quantum dot volume, with a diameter of 10 to 50 atoms. This corresponds to about 2 to 10 nanometers. For instance, spherical particles such as CdSe, InP, or CuInSe2, with a diameter of about 3 nm may be provided. The luminescent nanoparticles (without coating) may have the shape of spherical, cube, rods, wires, disk, multi-pods, etc., with the size in one dimension of less than 10 nm. For instance, nanorods of CdSe with the length of 20 nm and a diameter of 4 nm may be provided. Hence, in an embodiment the semiconductor based luminescent quantum dots comprise core-shell quantum dots. In yet another embodiment, the semiconductor based luminescent quantum dots comprise dots-in-rods nanoparticles. A combination of different types of particles may also be applied. Here, the term "different types" may relate to different geometries as well as to different types of semiconductor luminescent material. Hence, a combination of two or more of (the above indicated) quantum dots or luminescent nano-particles may also be applied.

One example, such as derived from WO 2011/031871, of a method of manufacturing a semiconductor nanocrystal is a colloidal growth process. Colloidal growth occurs by injection an M donor and an X donor into a hot coordinating solvent. One example of a preferred method for preparing mono disperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow size distribution of diameters. The small size distribution of diameters can also be referred to as a size. Preferably, a mono disperse population of particles includes a population of particles wherein at least about 60% of the particles in the population fall within a specified particle size range.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from the group consisting of" is applied in some of the above lists of quantum dot materials.

For example, the semiconductor nanocrystal can include a core having the formula MX, where M can be cadmium, zinc, magnesium, mercury, aluminum, gallium, indium, thallium, or mixtures thereof, and X can be oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InGaP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In an embodiment, more than one overcoating can be included on a core.

In an embodiment, the surrounding "shell" material can have a band gap greater than the band gap of the core material. In certain other embodiments, the surrounding shell material can have a band gap less than the band gap of the core material.

In an embodiment, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell (see further also above for examples of specific wavelength converter nanoparticles, based on semiconductors. Note that the shell as (inorganic) coating as described herein, may be a coating on the semiconductor nanocrystal. Should this QD be a core-shell nanoparticle, then the (inorganic coating) is a coating on the shell, i.e. a shall at least partially, even more especially entirely, enclosing the luminescent nanoparticle.

Especially, the wavelength converter comprises 0.01-25 wt. % wavelength converter nanoparticles (especially QDs) relative to the total weight of the wavelength converter, such as 0.1-5 wt. %, The concentration of the QDs in the first host material is preferably between 0.5% and 25% wt. The concentration of porous particles (comprising the QDs in the first curable host) in the second host matrix determines the overall concentration of QDs in the wavelength converter. In an embodiment, semiconductor nanocrystals preferably have ligands attached thereto, such as e.g. described in WO 2011/031871. In an embodiment, the ligands can be derived from the coordinating solvent used during the growth process. In an embodiment, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, carboxylic acids, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

More specifically, the coordinating ligand can have the formula:

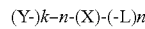

(Y-)k-n-(X)-(-L)n wherein k is 2, 3 4, or 5, and n is 1, 2, 3, 4 or 5 such that k–n is not less than zero; X is O, OS, O—Se, O—N, O—P, O—As, S, S=0, S02, Se, Se=0, N, N=0, P, P=0, C=0 As, or As=0; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, Cl-4 alkylcarbonyloxy, Cl-4 alkyloxycarbonyl, Cl-4 alkylcarbonyl, or formyl. The hydrocarbon chain can also be optionally interrupted by -0-, —S—, N(Ra)-, —N(Ra)-C (0)-0-, -0-C(0)-N(Ra)-, —N(Ra)-C(0)-N(Rb)-, —O—C(0)-0-, —P(Ra)-, or —P(0)(Ra)-. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

Further ligands may especially be one or more of oleic acid, and tri-octyl phosphine, and tri-octyl phosphine oxide. Hence, ligands may especially be selected from the group of acids, amines, phosphines, phosphine oxides and thiols.

A suitable coordinating ligand can be purchased commercially or prepared by ordinary synthetic organic techniques, for example, as described in J. March, Advanced Organic Chemistry. Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated by reference in its entirety. Other examples of ligands include benzylphosphonic acid, benzylphosphonic acid including at least one substituent group on the ring of the benzyl group, a conjugate base of such acids, and mixtures including one or more of the foregoing. In an embodiment, a ligand comprises 4-hydroxybenzylphosphonic acid, a conjugate base of the acid, or a mixture of the foregoing. In an embodiment, a ligand comprises 3,5-di-teri-butyl-4-hydroxy-benzyl-phosphonic acid, a conjugate base of the acid, or a mixture of the foregoing. Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand and Method", each of the foregoing being hereby incorporated herein by reference.

As indicated above, the present process may also be applied for non-quantum dot luminescent nano particles.

After having introduced the first liquid into the pores of the particulate porous inorganic material, optionally the material may be washed. In case of an incipient wetness technique for filling the pores, this may not be necessary, but when there is a surplus of first liquid, it may be desirable to wash the particles. This may in an embodiment be done after separating the particulate material from the first liquid. Especially, the washing liquid is a non-solvent for the polymerizeble precursor. A non-solvent may be defined as a liquid wherein a material, here the polymerizeble precursor does not dissolve or only solves up to an amount of 0.01 g/l. Hence, the invention also provides a process wherein before curing or polymerizing but after impregnation the particles are washed with a solvent, especially with a solvent which is a non-solvent for the curable or polymerizable precursor. In a specific embodiment, there is no washing at all before curing or polymerizing.

Hence, in general, the process may include filling the pores with the first liquid, separating the particles with (at least partly filled pores) from the first liquid, optionally washing the particles, and curing/polymerizing the curable or polymerizable precursor (which is (at least) available in the pores. Separation may be done with techniques known in the art, such as filtration, (gravity) sedimentation and decanting, etc. An interesting option is to use a filter. On such filter, such as a Buchner funnel, the micro particles are collected. The micro particles may be washed, if desired, to remove excess and/or remaining first liquid at the surface of the particles. Hence, especially the invention also provides a process wherein before curing or polymerizing but after impregnation the particles, the impregnated particles and possible remaining first liquid are separated. Thereafter, the material in the pores of the porous cores may be subjected to the curing/polymerization. Herein, the term "possible remaining first liquid" is applied, as in the case of an incipient wetness technique, or a deliberate filling amount of first liquid smaller than the pore volume, may lead to a situation wherein there is no remaining liquid to be removed.

If desired, however, this washing may deliberately be used to remove the precursor. In such instances it appears that the nanoparticles remain in the pores, without polymerizeble precursor, or with substantially no polymerizeble precursor. In such embodiment, curing may lead to a very low amount or no polymeric material. In such embodiment, it may be desirable to embed the particles in a matrix (see also above for matrices). Therefore, in a further aspect the invention provides a process for the production of a (particulate) luminescent material comprising particles, especially substantially spherical particles, having a porous inorganic material core with pores, especially macro pores, which are at least partly filled with a polymeric material with luminescent nanoparticles, especially quantum dots, embedded therein, wherein the process comprises (i) impregnating the particles of a particulate porous inorganic material with pores with a first liquid ("ink") comprising the luminescent nanoparticles, especially quantum dots, and (optionally) a curable or polymerizeble precursor of the polymeric material, to provide pores that are at least partly filled with said luminescent nanoparticles, especially quantum dots, and (optional) curable or polymerizeble precursor, washing the thus obtained particles with a solvent for the curable or polymerizeble, or with a solvent for the first liquid; optionally (ii) curing or polymerizing the curable or polymerizeble precursor within pores of the porous material. In a specific embodiment, the process further comprises (iii) applying an encapsulation (such as coating, or embedding in a matrix, or both) to the thus obtained particles (with pores that are at least partly filled with luminescent nanoparticles, especially quantum dots). Hence, in these embodiment, the first liquid may not necessarily include a polymerizeble (or curable) material. Thus, with a suitable solvent, i.e. a solvent for the first liquid may be washed away (rinsed out) while the particles appear to stay embedded in the pores. A solvent for the first liquid may of course also be a combination of solvents. Further, the solvent for the first liquid may especially be a solvent or combination of solvents that is able to solve the one or more liquid components of the first liquid.

In general, the first liquid is a liquid wherein the nanoparticles can be well dispersed.

In yet a further embodiment, after filling the pores with the first liquid (with quantum dots) and curing and/or polymerizing the curable or polymerizeble material (with QDs) in the pores, the particles are subjected to a second filling. This second filling can be done with the same first liquid. However, this second filling can also be done with the same first liquid without QDs. Though in general the pores are well filled, such second filling may be used to completely fill the pores in case a first filling of the pores might not have been (deliberately) complete. Of course, such multi-stage process may also be applied to fill with different types of QD's. In this way a layered QD structure may be obtained within the pores. It may for instance be advantageous to fill the pores partly first with a first type of QDs' and thereafter with a second type of QD's (according to the process as described herein), wherein especially the first type of QD's emit at a longer wavelength than the second type of QD's.

As indicated above, the invention also provides a wavelength converter per se, i.e. a wavelength converter comprising a light transmissive solid matrix with the (particulate) luminescent material (as defined herein, and/or obtainable according to the process defined herein) embedded therein (see also above).

Especially, such wavelength converter may further comprise a second luminescent material. Especially, the second luminescent material under excitation with light has (will have) another wavelength distribution of the luminescence than the luminescent quantum dots. For instance, even QD's with substantially the same chemical composition (of the core), but having other dimensions may already result in different emissions. This second luminescent material may thus have a different emission than the quantum dots or mixture of quantum dots (under the same excitation wavelength). Optionally, however, the second luminescent material may also be excited by luminescence light of the QDs.

By using a mixture of different types of QDs and/or a second luminescent material, the luminescence of the wavelength converter, and thus, where applicable, also the lighting device light of the lighting device may be tuned.

Also other species (in addition to the monomers and the wavelength converter nanoparticles) may be present in the starting mixture (of the curable or polymerizable precursor and QDs and/or the precursor of a polymeric host material (matrix) and may be incorporated in the polymeric (host) material. For instance, reflective particles like TiO2 particles may also be incorporated. Also inorganic luminescent material, not having nanoparticle character, like micron sized particulate inorganic luminescent materials may be present, as well as the above indicated cross-linker. Information about the monomers and the wavelength converter nanoparticles, as well as about the optional radical initiator, are indicated above. As can also be derived from the above, the mixture (i.e. especially the first liquid comprising the luminescent quantum dots and a curable or polymerizable precursor of the polymeric material) may comprise 0.01-25 wt. % wavelength converter nanoparticles relative to the total weight of the mixture.

As indicated above, the invention also provides a lighting device comprising (i) a light source configured to generate light source light, (ii) the (particulate) luminescent material as defined herein or obtainable by the process as defined herein, wherein the (particulate) luminescent material is configured to convert at least part of the light source light into visible luminescent quantum dot light.

In a specific embodiment, the lighting device comprises the wavelength converter as defined herein, arranged at a non-zero distance from the light source. However, also other arrangements may be chosen to arrange the (particulate) luminescent material at a non-zero distance from the light source (such as at a non-zero distance from an LED die). It may be advantageous, in view of efficiency and/or stability, to arrange the QDs, or especially the wavelength converter, at a non-zero distance, such as 0.5-50 mm, like 1-50 mm, from the light source. Hence, in an embodiment, the wavelength converter may be configured at a non-zero distance of the light source.

Alternatively or additionally, the luminescent material or the wavelength converter is directly applied to a light emitting surface of the light source, such as directly on an LED die (see also above).

Further, the method may comprise enclosing the thus obtained wavelength converter by an encapsulation, especially an oxygen non-permeable encapsulation. Especially, this encapsulation is applied while the wavelength converter is still under the reduced oxygen and water atmosphere. Hence, the wavelength converter may (also) be encapsulated. The wavelength converter may be a film, a layer, such as a self supporting layer, or a body.

The wavelength converter can be configured as light exit window of the lighting device. Hence, in such embodiment, light from the light source and converter light (see further below) may emanate from the lighting device via and from the wavelength converter (during use of the device). The wavelength converter may also be configured in reflective mode. For instance, a light mixing chamber may comprise one or more wall(s) comprising the wavelength converter (reflective mode) and/or an exit window comprising the wavelength converter (transmissive mode).

The wavelength converter (or more precisely the wavelength converter nanoparticles) is (are) radiationally coupled to the light source (or, as indicated above, a plurality of light sources). The term "radiationally coupled" especially means that the light source and the wavelength converter are associated with each other so that at least part of the radiation emitted by the light source is received by the wavelength converter (and at least partly converted into luminescence). The term "luminescence" refers to the emission which emits the wavelength converter nanoparticles emit upon excitation by the light source light of the light source. This luminescence is herein also indicated as converter light (which at least comprises visible light, see also below).

The wavelength converter will in general also be configured downstream of the light source. The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The device is especially configured to generate device light, which at least partly comprises the converter light, but which may optionally also comprise (remaining) light source light. For instance, the wavelength converter may be configured to only partly convert the light source light. In such instance, the device light may comprise converter light and light source light. However, in another embodiment the wavelength converter may also be configured to convert all the light source light.

Hence, in a specific embodiment, the lighting device is configured to provide lighting device light comprising both light source light and converter light, for instance the former being blue light, and the latter comprising yellow light, or yellow and red light, or green and red light, or green, yellow and red light, etc. In yet another specific embodiment, the lighting device is configured to provide only lighting device light comprising only converter light. This may for instance happen (especially in transmissive mode) when light source light irradiating the wavelength converter only leaves the downstream side of the wavelength converter as converted light (i.e. all light source light penetrating into the wavelength converter is absorbed by the wavelength converter).

The term "wavelength converter" may also relate to a plurality of wavelength converters. These can be arranged downstream of one another, but may also be arranged adjacent to each other (optionally also even in physical contact as directly neighboring wavelength converters). The plurality of wavelength converters may comprise in an embodiment two or more subsets which have different optical properties. For instance, one or more subsets may be configured to generate wavelength converter light with a first spectral light distribution, like green light, and one or more subsets may be configured to generate wavelength converter light with a second spectral light distribution, like red light. More than two or more subsets may be applied. When applying different subsets having different optical properties, e.g. white light may be provided and/or the color of the device light (i.e. the converter light and optional remaining light source light (remaining downstream of the wavelength converter). Especially when a plurality of light sources is applied, of which two or more subsets may be individually controlled, which are radiationally coupled with the two or more wavelength converter subsets with different optical properties, the color of the device light may be tunable. Other options to make white light are also possible (see also below).

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

Most of the embodiments described above include the filling of the pores with a first liquid ("ink") including a curable or polymerizeble precursor (and luminescent nanoparticles, especially luminescent quantum dots). Alternatively, the pores maybe filled with the luminescent nanoparticles in a liquid that is not subsequently cured or polymerized. For instance, the first liquid may evaporated thereby leaving the luminescent nanoparticles in the pores of the porous inorganic material core. Thereafter, the cores may be coated, especially via an atomic layer deposition process. Hence, in a further aspect, the invention also provides a process for the production of a luminescent material comprising particles having a porous inorganic material core with pores which are at least partly filled with luminescent quantum dots, wherein the process comprises: impregnating the particles of the particulate porous inorganic material with pores with a first liquid comprising the luminescent nanoparticles, such as luminescent quantum dots, to provide pores that are at least partly filled with said luminescent nanoparticles, such as luminescent quantum dots and liquid material (especially a solvent for the luminescent quantum dots); and optionally removing the liquid. Thereafter, optionally the porous inorganic material with pores at least partly filled with the luminescent nanoparticles, such as luminescent quantum dots may be coated with a coating, especially via an ALD process, to provide a coating on the (individual) particles. This coating or shell may have a thickness of at least 10 nm. The above described embodiments in relation to the particles, the luminescent nanoparticles, the coating and the encapsulation, etc., also apply to this aspect (i.e. luminescent nanoparticles in pores not being embedded in a polymer) of the invention. Especially, the coating (on the at least partly filled porous inorganic material with pores) as described herein encloses the particles entirely (core-shell particles (with the cores being the inorganic cores)). The invention also provides such luminescent material per se as well as a wavelength converter and/or a lighting device comprising such luminescent material (or wavelength converter comprising such luminescent material). Hence, in a further aspect the invention also provides a luminescent material comprising particles having an porous inorganic material core with pores which are at least partly filled with luminescent quantum dots (120), and wherein especially the particles are coated with an inorganic coating (of at least 10 nm thickness). Hence, the luminescent nano particles are especially enclosed in the pores and are protected by the coating closing said pores. Thus, especially, the particles have one or more (even more especially all) of the following features (i) having particle sizes (ps) in the range of 1-500 (ii) wherein the particles comprise an encapsulation encapsulating at least part of the core, (iii) wherein the porous inorganic material comprises one or more of a porous silica, a porous alumina, a porous glass, a porous zirconia, and a porous titania, (iv) wherein the pores have mean pore sizes (dp) in the range of 0.1-10 µm, and (v) wherein the encapsulation (220) comprises an inorganic coating. Such particles may further be embedded in a polymeric matrix, to provide e.g. the wavelength converter. A suitable solvent to introduce the luminescent nanoparticles, such as luminescent quantum dots, into the pores especially comprise one or more of an alkane (such as hexane, heptane), toluene, chloroform, an alcohol (such as one or more of ethanol and butanol), and water. Ligands attached to the nanoparticles may facilitate solvation of the nano particles in the solvent (see also above).

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 shows the in-situ impregnation of Trisoperl PSP's with Ebecryl 150. The black interior (non-filled parts) slowly disappear over time;

FIG. 6d shows the curve (curve 4) "Impregnated ALD-c, air" which is obtained after the impregnated ALD particles are directly subjected to photoluminescence measurements under air conditions (thus without an earlier measurement of the PL as function of time under N2). The curves in FIGS. 6a-6d are indicated below in table 1.

TABLE 1 overview of curves in FIGS. 6a-6d

Figure 6A:
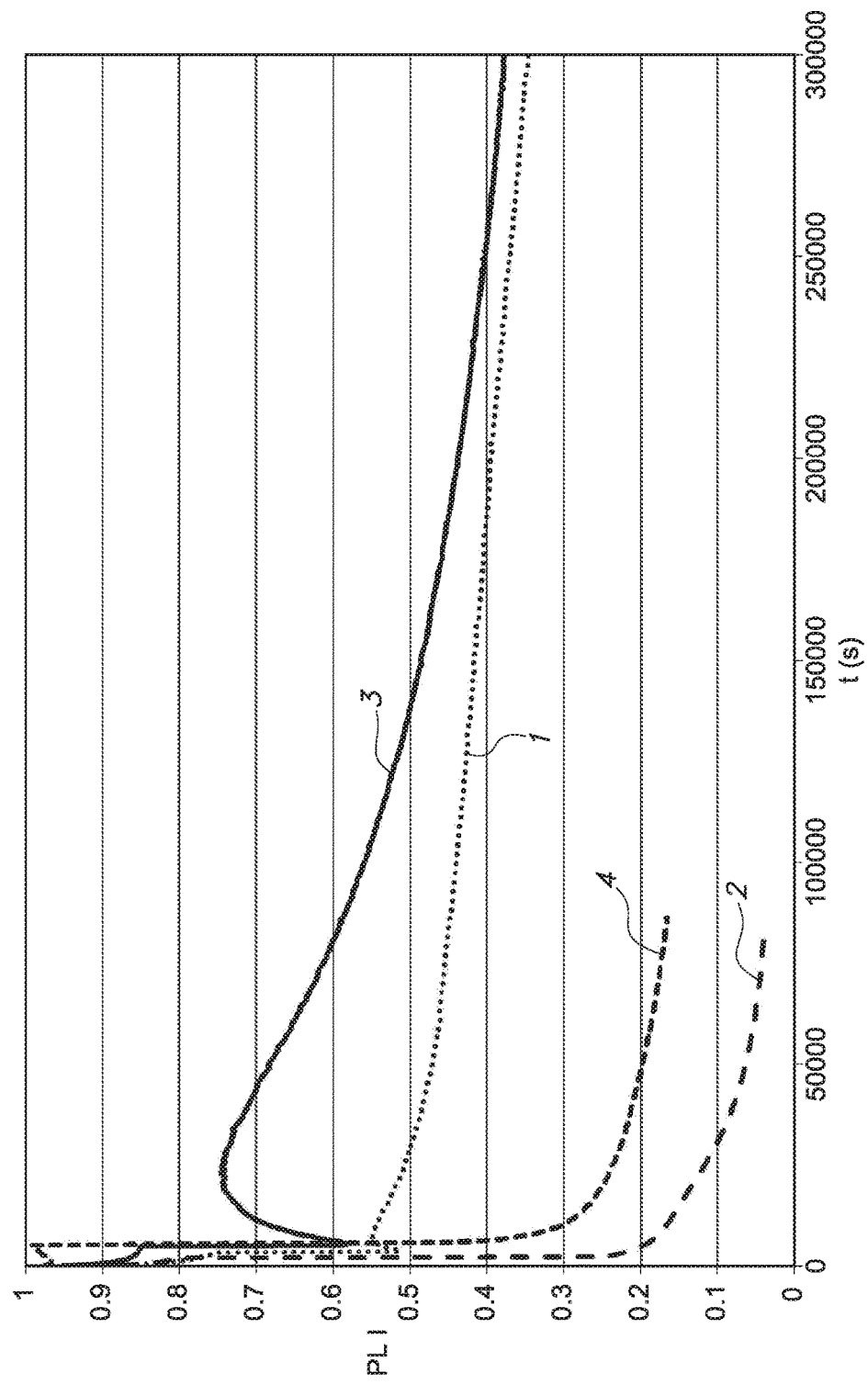
FIG. 6a shows the normalized photoluminescence intensity (PL I) as function of time (t, in seconds) for a non-impregnated sample and impregnated sample, in N2 and in air atmosphere. All measurements are performed at 10 W/cm2 blue flux and 100° C.
Figure 6B:
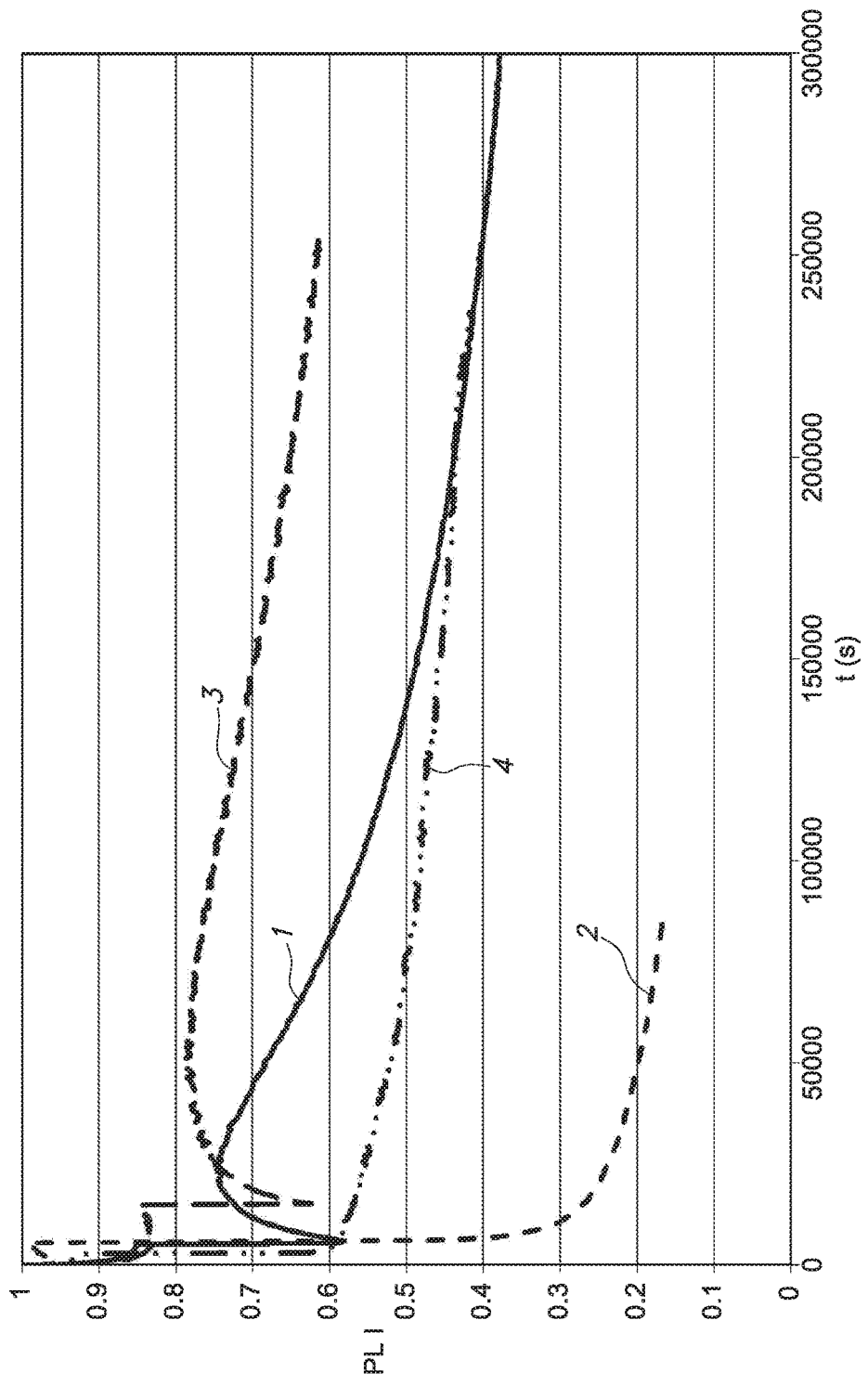
FIG. 6b shows the normalized photoluminescence intensity (PL I) as function of time for impregnated samples with and without ALD coating, in N2 and in air atmosphere. All measurements are performed at 10 W/cm2 blue flux and 100° C.
Figure 6C:
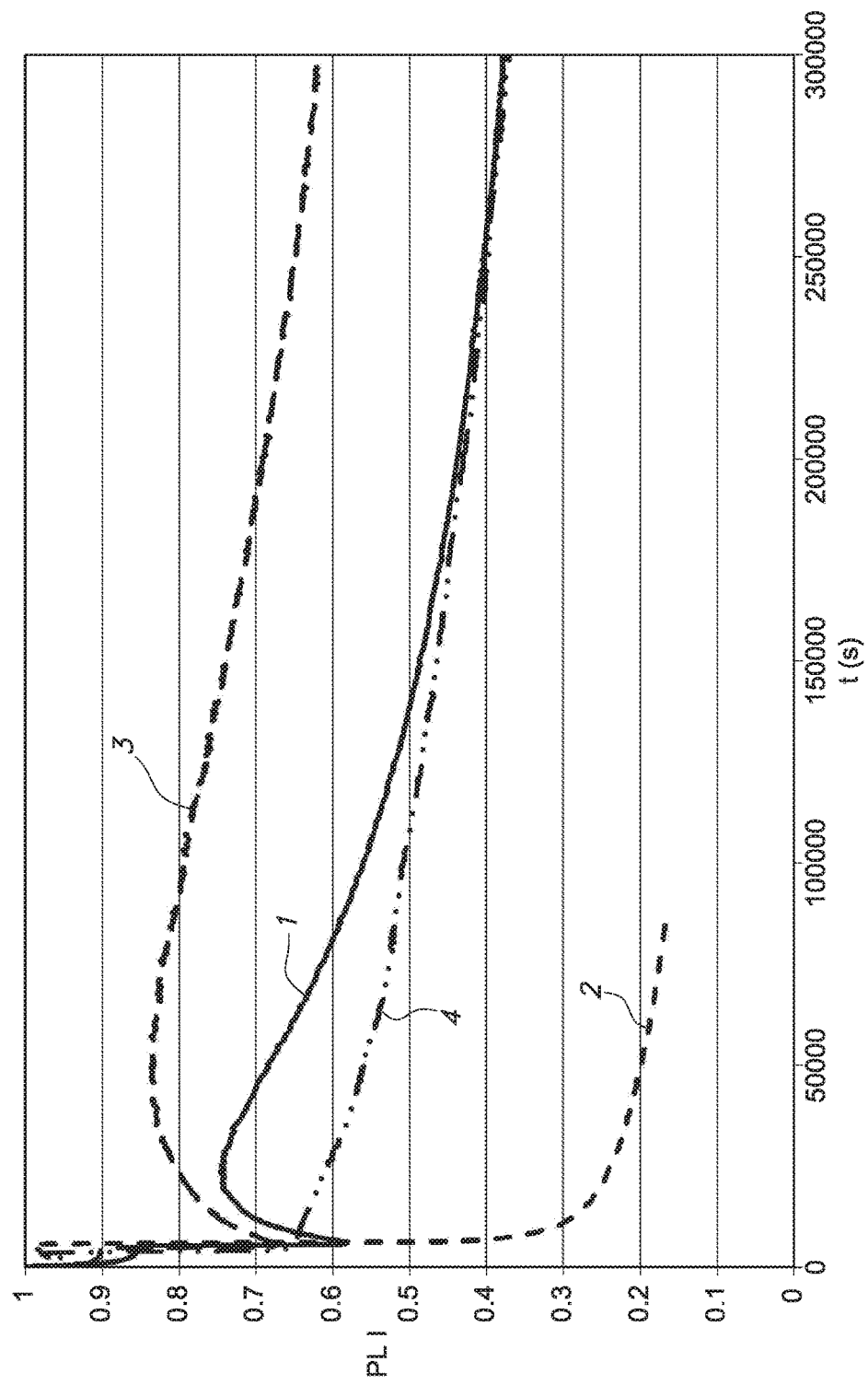
FIG. 6c shows the normalized photoluminescence intensity (PL I) as function of time (t, in seconds) for impregnated samples with and without ALD coating, in N2 and in air atmosphere. All measurements are performed at 10 W/cm2 blue flux and 100° C.; and also
Figure 6D:
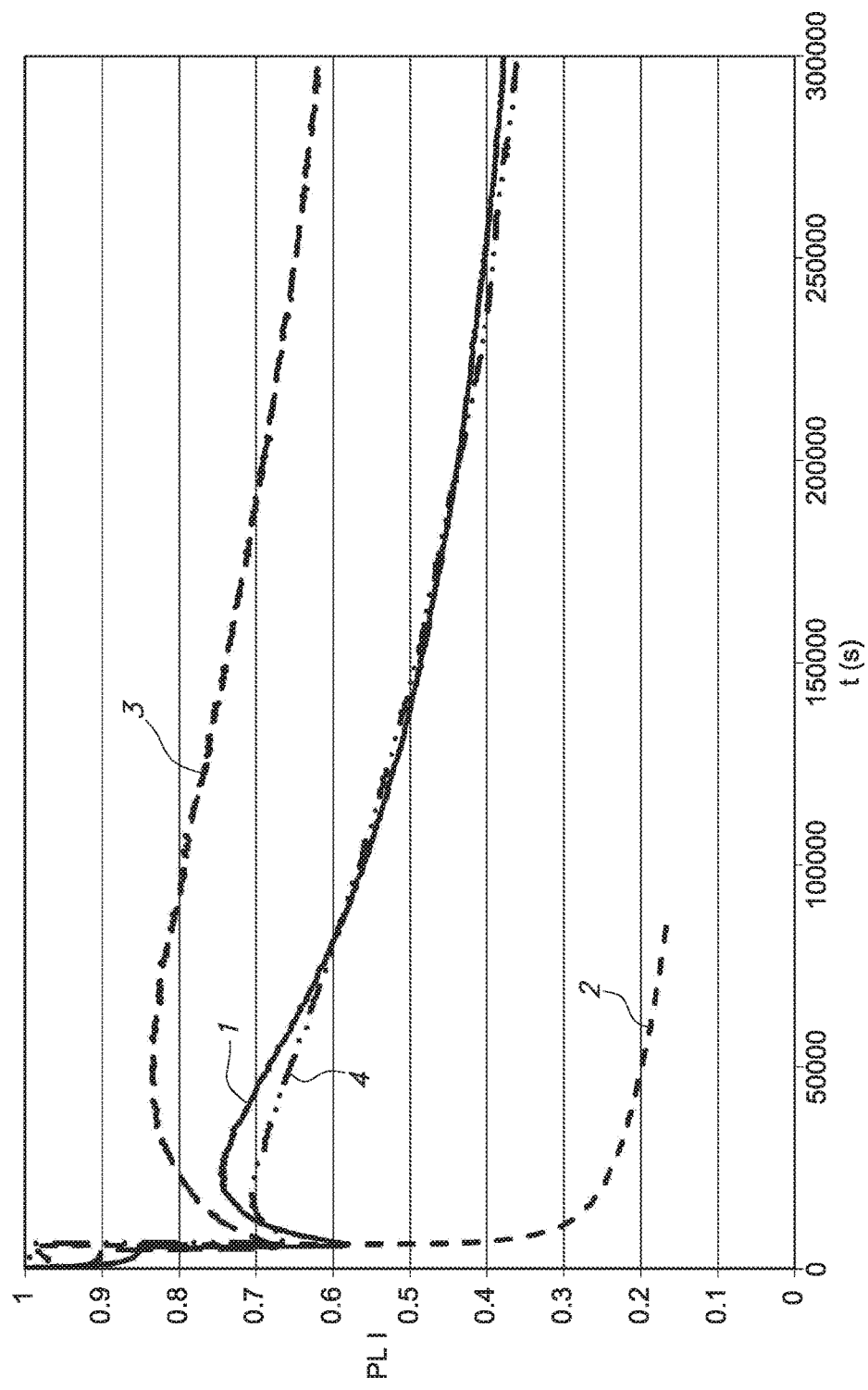
FIG. 6d shows the normalized photoluminescence intensity (PL I) as function of time (t, in seconds) for impregnated samples with and without ALD coating, in N2 and in air atmosphere. All measurements are performed at 10 W/cm2 blue flux and 100° C. Whereas in FIGS. 6b and 6c the curves for "Impregnated ALD-a/c, air" are a continuation in time of the same samples indicated in the same graphs, respectively, as "Impregnated ALD-a/c, N2"

| Fig. | Curve 1 Curve 2 Curve 3 Curve 4 |
|---|---|
| FIG. 6a | no impregnation, N2 no impregnation, air impregnated, no ALD, N2 impregnated, no ALD, air |
| FIG. 6b | impregnated, no ALD, N2 impregnated, no ALD, air impregnated, ALD-a, N2 impregnated, ALD-a, air |
| FIG. 6c | impregnated, no ALD, N2 impregnated, no ALD, air impregnated, ALD-c, N2 impregnated, ALD-c, air |
| FIG. 6d | impregnated, no ALD, N2 impregnated, no ALD, air impregnated, ALD-c, N2 impregnated, ALD-c, air |

Figure 7A:
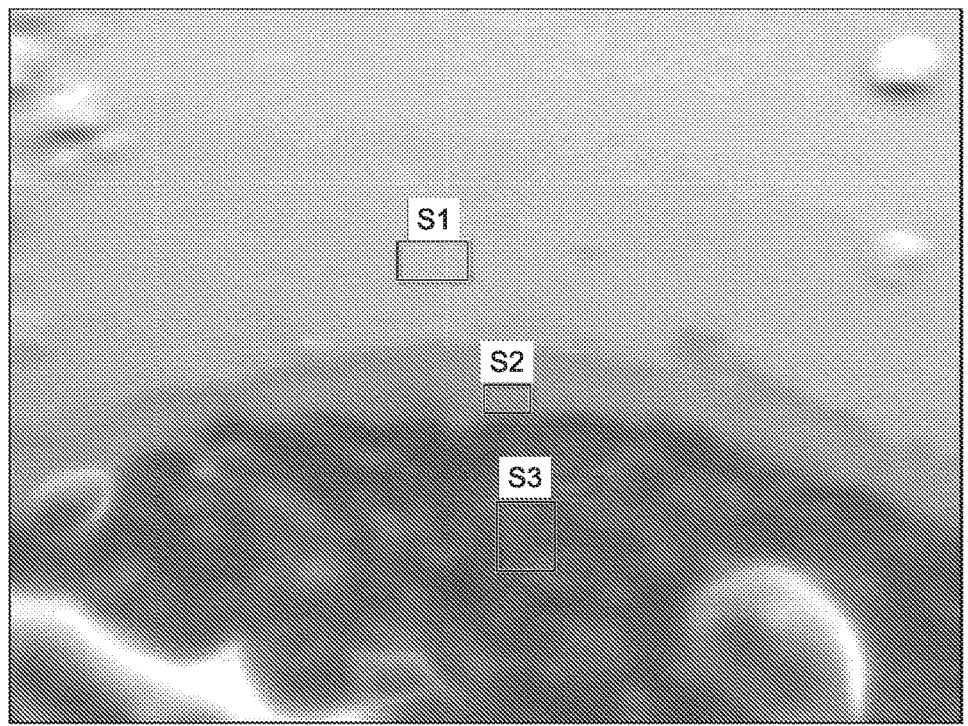
Figure 7B:
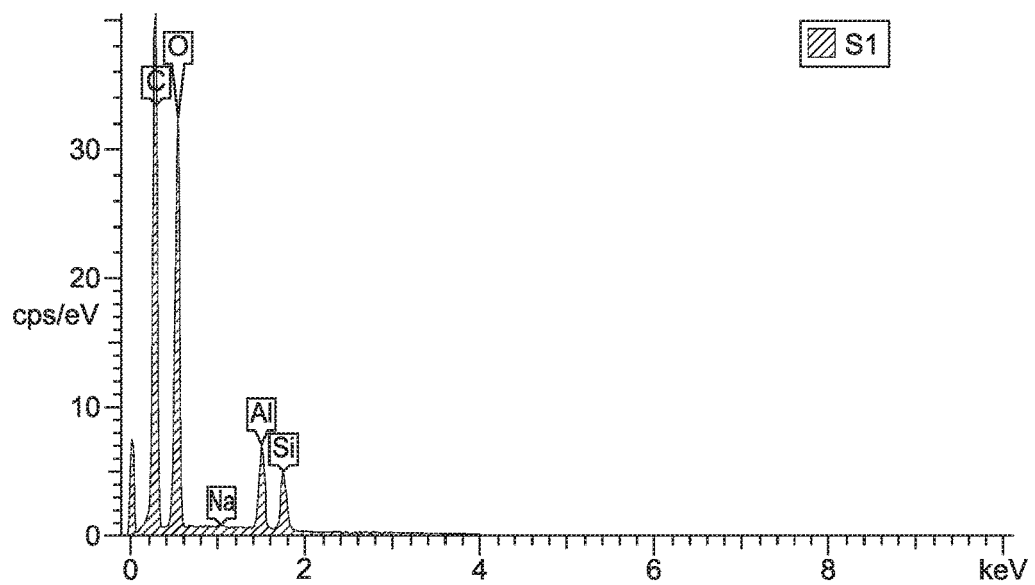
Figure 7C:
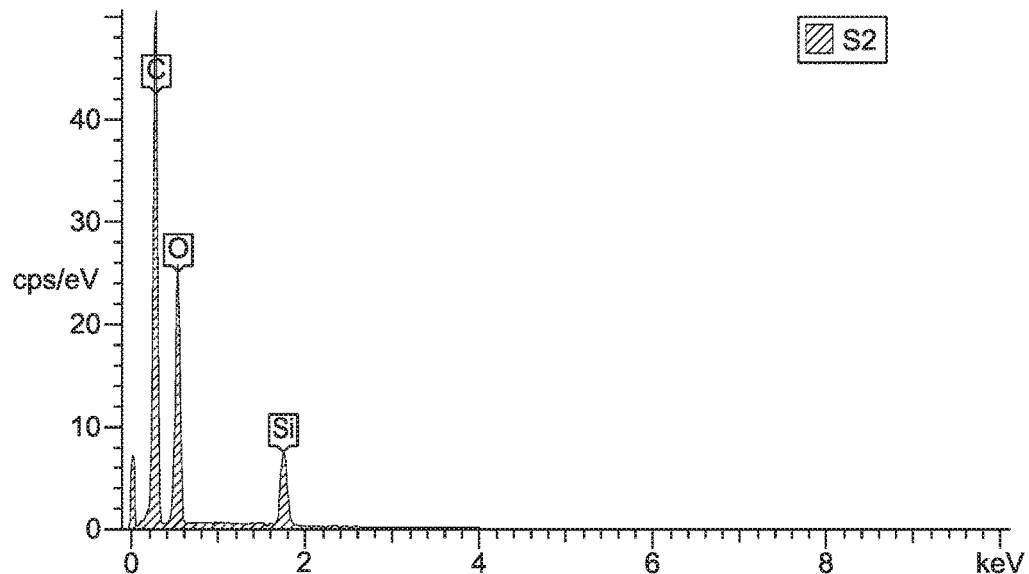
Figure 7D:
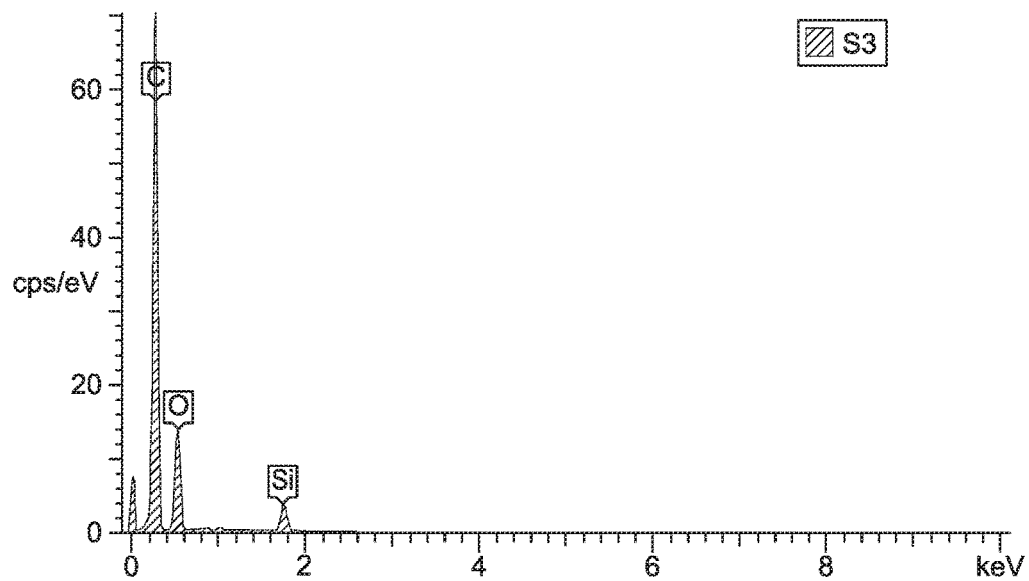
Figure 8A:
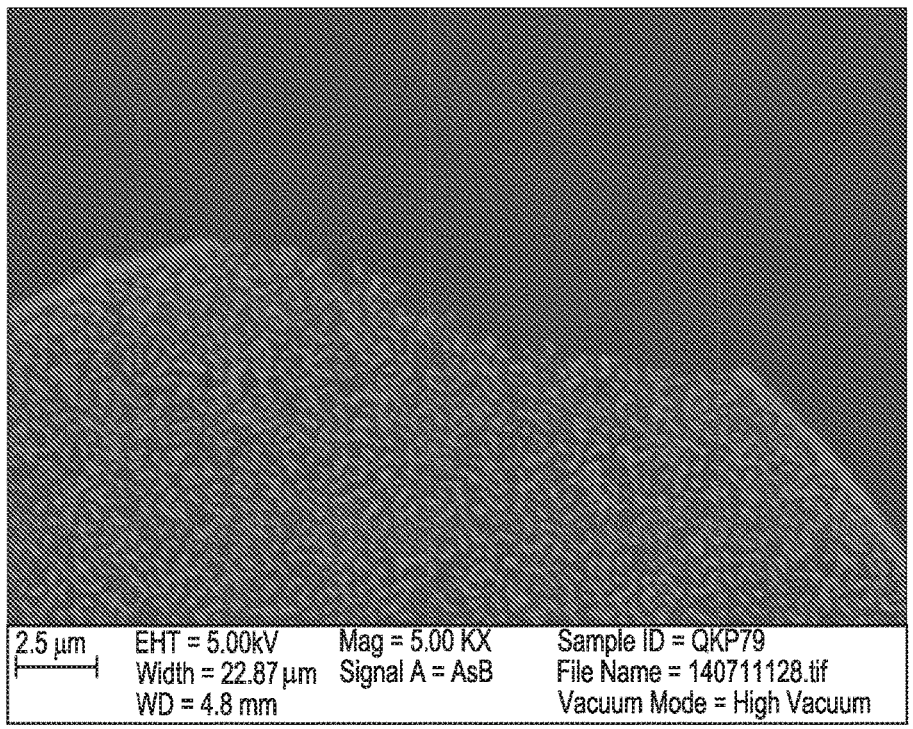
Figure 8B:
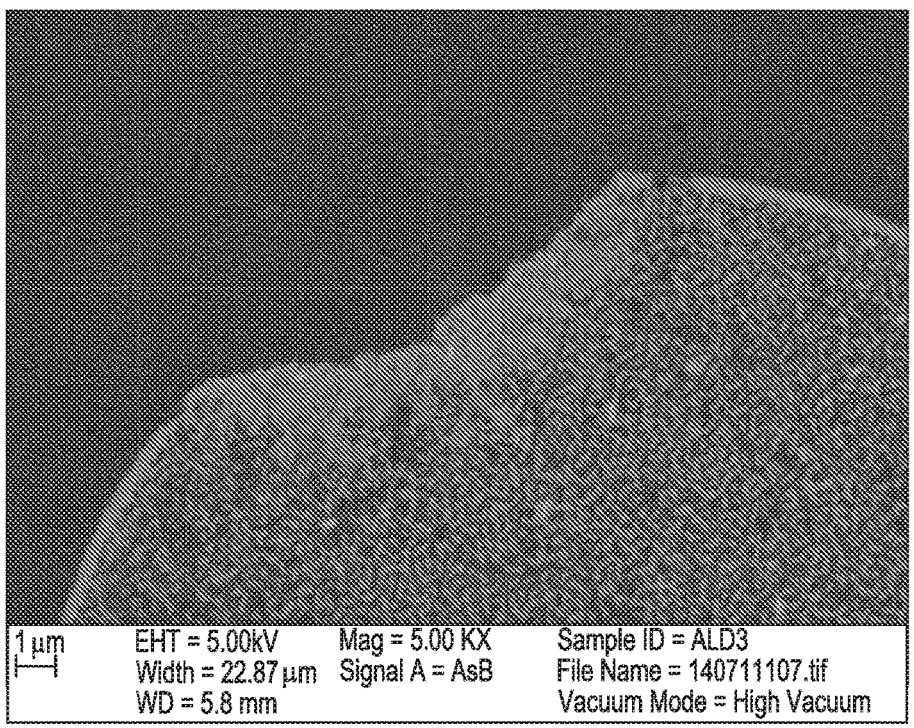
Figure 8C:
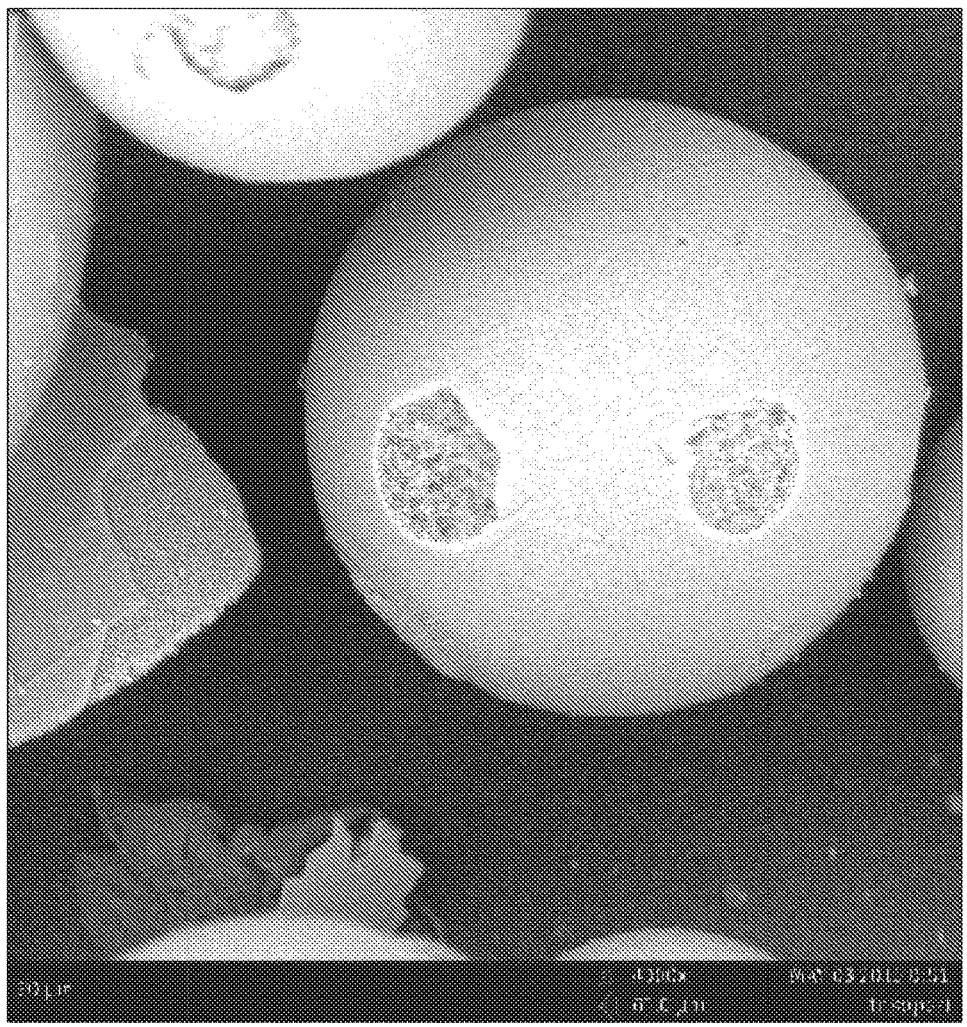

FIG. 7a SEM image of a cross-section of an ALD-b particle. The spectra (S1-S3) show the elemental analysis by EDX of the regions indicated in the SEM image (FIGS. 7b-7d, respectively);

FIGS. 8a-8b show SEM images of the fill opening of a non-ALD coated PSP batch 1 (8a) and ALD-b coated PSP (8b); FIG. 8c shows a SEM of particles in more detail. The fill openings are clearly visible.

DETAILED DESCRIPTION OF THE EMBODIMENTS

Figure 1A:
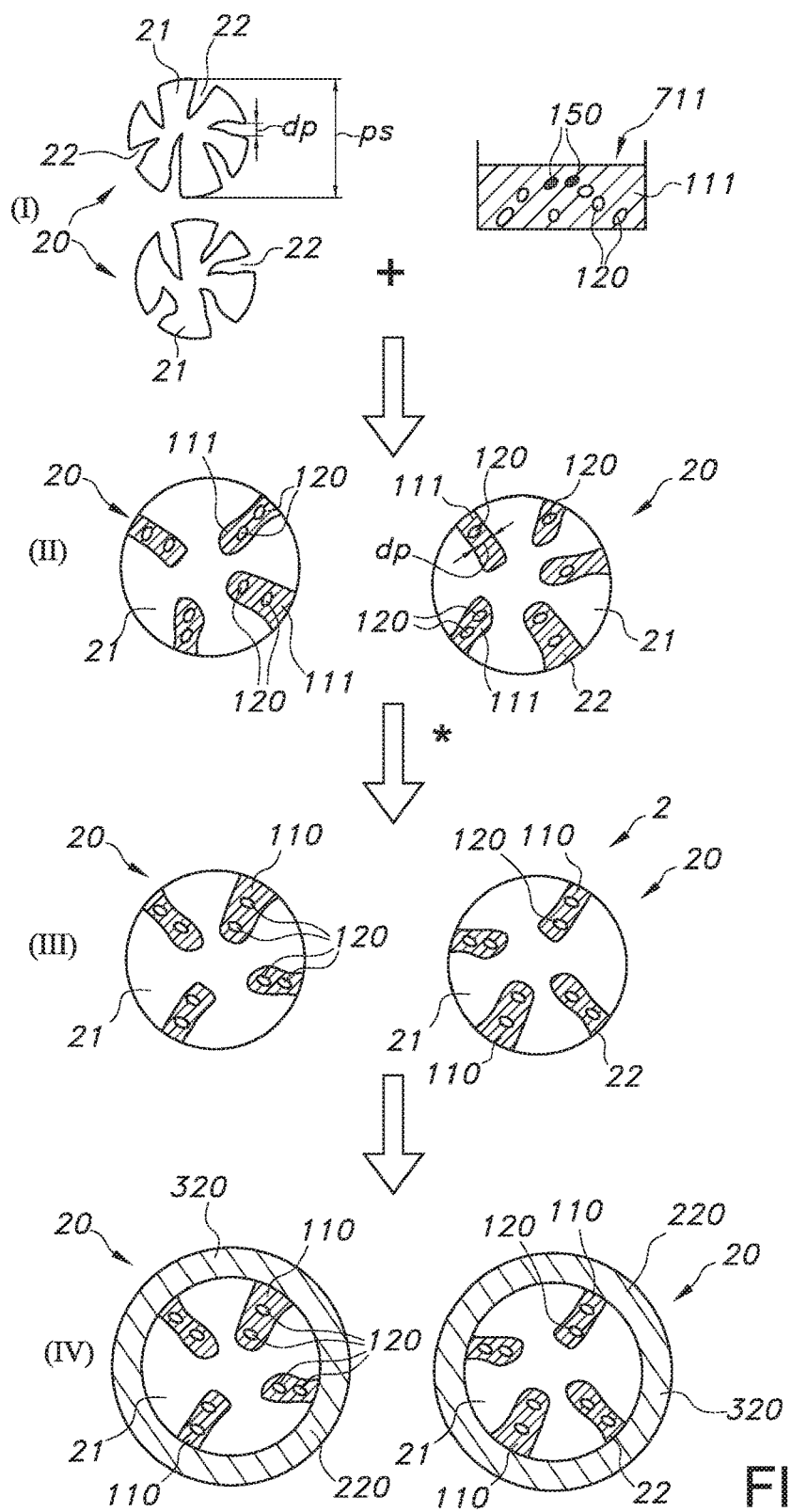
FIGS. 1a-1d schematically depict some aspects of an embodiment of the process and of the luminescent material.

FIG. 1a schematically depicts first particles 20 having a porous inorganic material core 21 and pores 22 which can be combined with a liquid comprising curable or polymerizable precursor 111. The liquid is indicated with reference 711. The liquid further comprises quantum dots 120 and optionally a second luminescent material 150. This second luminescent material 150 is indicated as discrete items, such as particles, but may however also comprise molecules, like inorganic molecules or organic molecules, that are molecularly dispersed in the liquid 711. In an embodiment, the liquid 711 comprises as liquid components essentially curable or polymerizable precursor 111 and optionally cross-linkers or initiators for polymerization. The particles 20 and the liquid 711 are mixed (stage I), whereby particles with filled pores are obtained (stage II). After filling, excess of liquid 711 may be removed.

Then, the curable or polymerizable precursor is brought to curing or polymerization. This may for instance be done by providing UV light and/or thermal energy, etc. to the curable or polymerizable precursors. After reaction, stage III is obtained with particles 20 with at least partly filled pores, which are filled with polymeric material 110 with luminescent quantum dots embedded therein. This particulate material is luminescent, and will give light upon excitation by UV and/or blue light, due to the presence of the QDs. This particulate material is herein also indicated as luminescent material 2. In this stage, the particles 20 are identical to the porous cores 21.

Figure 1B:
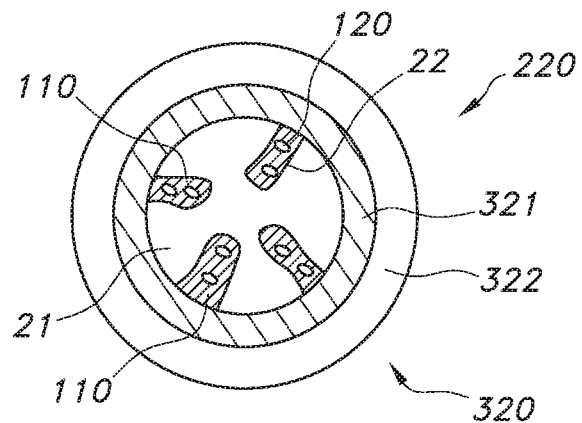
Figure 1C:
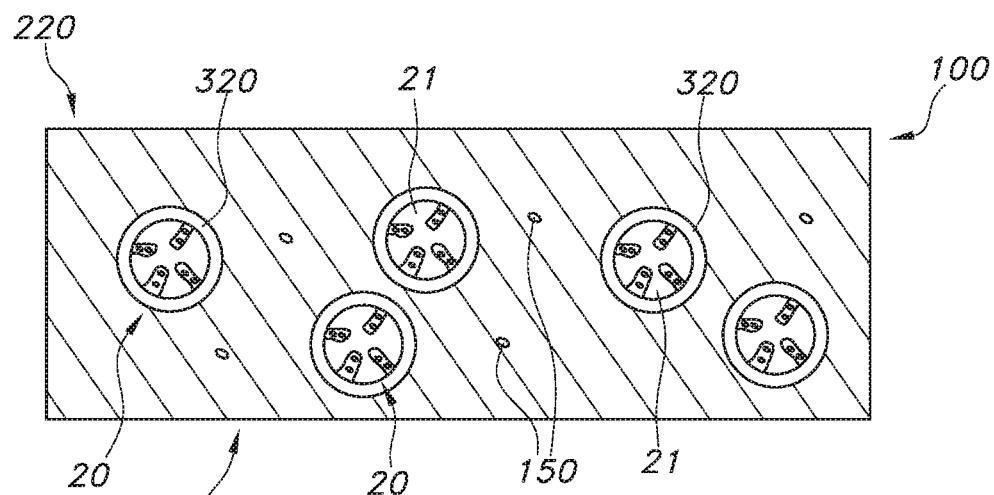

Optionally, the process may be continued by encapsulating the thus obtained particulate luminescent material 2, with one or more of a coating and a host matrix. Embodiments of products thereof are schematically depicted in FIGS. 1b and 1c, respectively. The result of a coating process is shown in stage IV, wherein the particles 20 are enclosed by encapsulation 220, and here in the form of a coating 320. Coating may for instance be performed in a fluid bed reactor with coating precursors that form a coating on the particles 20, optionally after further processing steps.

FIG. 1b schematically depicts an embodiment wherein a multilayer coating 320 is applied to such luminescent material particle 20, here with a first layer 321, directly adjacent to the core, and further remote a second layer 322, directly adjacent to the first layer 321. For instance, the former layer may be a thin inorganic layer, and the second layer may be a thick(er) inorganic layer (or vice versa). Optionally, a plurality of alternating first and second layers may be applied, which may be all organic, all inorganic, or a combination thereof. For example, the multilayer coating comprises alternating first and second layers of an inorganic material, for instance alternating first and second layers of an aluminum containing oxide and a titanium containing oxide, or alternating first and second layers of an aluminum containing oxide and a zirconium containing oxide. The total thickness of the multilayer coating may be in the range of 20-100 nm, more preferably in the range of 30-80 nm. The thickness of the first and second layers may be in the range of 0.2-10 nm, more preferably in the range of 1-5 nm.

Figure 1D:
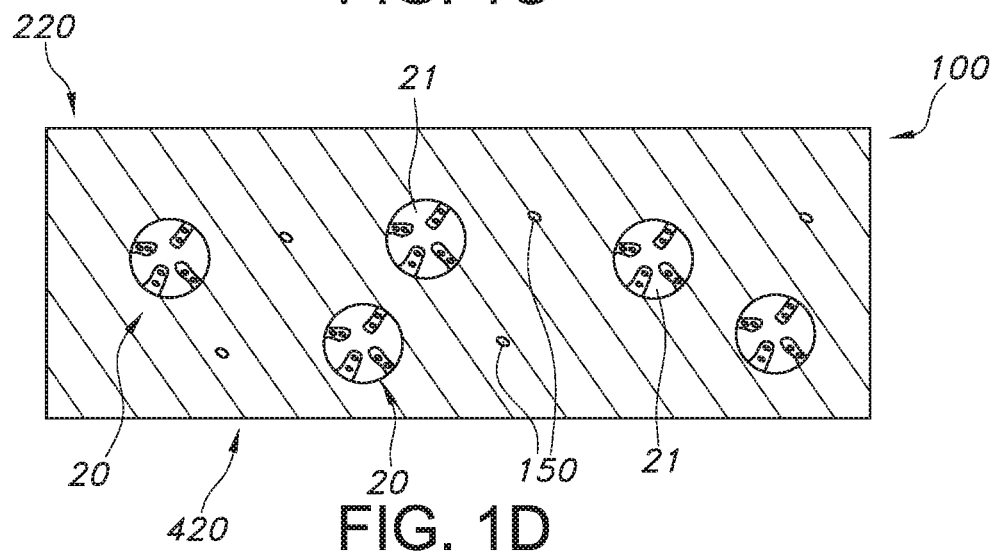

FIG. 1c schematically depicts the particulate luminescent material 2 embedded in a matrix 420. Such system may also be indicated as wavelength converter 100. By way of example, this wavelength converter 100 comprises also the second luminescent material 150. FIG. 1d schematically depicts an embodiment wherein the particles obtained in stage III are embedded in the matrix 420. The polymeric material (110; see FIG. 1a) can be seen as primary encapsulation, the coating 320 can be seen as secondary encapsulation, and the matrix 420 can be seen as tertiary encapsulation.

Figure 1E:
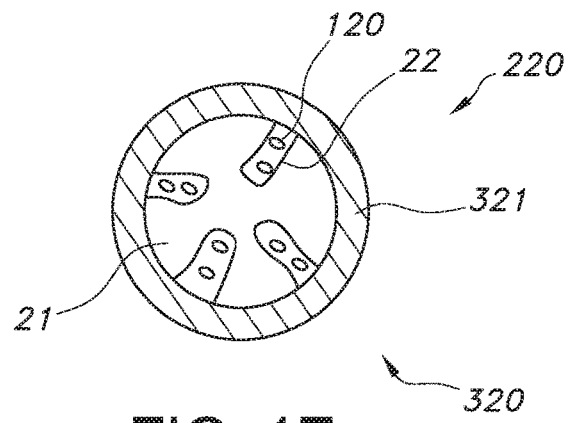

FIG. 1e schematically depicts an example of a luminescent material particle 20 with a coating 320 (by way of example a single layer 321, though a multi-layer may also be possible. Here, the quantum dots 120 have been introduced into the pores without a polymerizeble or curable precursor. For instance, the liquid with the quantum dots 120 have been introduced, may have been evaporated before the coating 320 has been applied.

FIGS. 1a(IV), 1b, 1c, and 1e all show schematically embodiments wherein the (first) coating layer is in contact with the core over 100% of the entire outer surface area (A) of the particle (or core). Note that these luminescent material particles 20 comprise inorganic cores 21 with (optionally) a coating or shell 320 surrounding the cores. In the pores of these pores, luminescent nano particles or quantum dots 120 are available. These nanoparticles may also be core-shell type particles (not specifically depicted). Hence core-shell type quantum dots may be available in the pores of cores that on their turn are coated with a coating or encapsulation (or shell).

Pore size is indicated with reference dp, which in general indicates a mean dimension of pore width or pore diameter. The particle size is indicated with ps, which in general indicates a mean dimension of particle width, particle length or particle diameter.

Figure 2A:
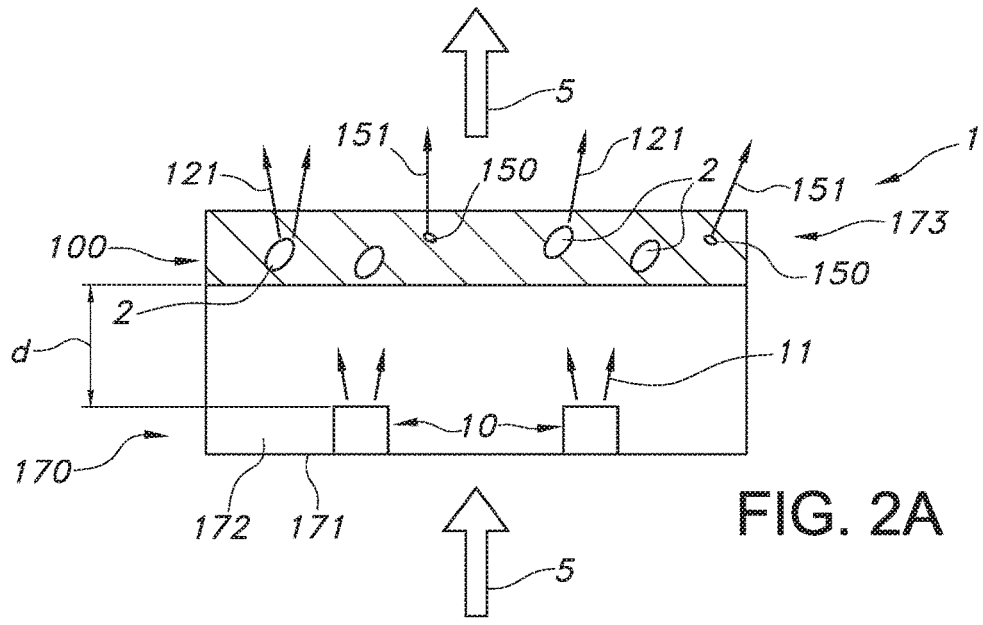
FIGS. 2a-2e schematically depict some aspects of an embodiment of the lighting device.

FIG. 2a schematically depicts a lighting device 1. The lighting device 1 comprises a light source 10 configured to generate light 11, such as blue or UV light, or both. Here, by way of example two light sources 10 are depicted, though of course more than two, or only one, may be present. Further, the lighting device 1 comprises the luminescent material 2. The (particulate) luminescent material 2 is configured to convert at least part of the light source light 11 into visible luminescent quantum dot light 121, e.g. one or more of green, yellow, orange and red light. Here, a light converter 100 is depicted, such as e.g. depicted in FIG. 1c. By way of example, the lighting device 1 further comprises the second luminescent material 150, which provides upon excitation second luminescent material light or luminescence 151. This luminescence 151 will in general have another spectral light distribution than the visible luminescent quantum dot light 121. All light generated by the lighting device is indicated with lighting device light 5, which in this schematic embodiment comprises visible luminescent quantum dot light 121 and the optional second luminescent material light 151. Note that the luminescent quantum dots, or here the light converter 100, is arranged at a non-zero distance d from the light source(s) 10.

As indicated above, the inorganic host particles after impregnation with the quantum dots and after curing and/or polymerization may be used as such (i.e. after stage III in FIG. 1a). In such instance, the particles have no coating. However, also in these embodiments the term "core" is applied, though the particle may entirely consist of such core. Optionally the particles are encapsulated (stage IV in FIG. 1A; FIGS. 1B-1D). This may be a coating (stage IV in FIG. 1A; FIG. 1B) i.e. in principle each particle may include a coating around the core: core-coating particles. However, the particles may also be embedded 20 in a matrix, such as a film or body: (FIGS. 1C & 1D) such matrix encapsulates a plurality of the coated cores (FIG. 1C) or a plurality of non-coated cores (FIG. 1D); of course, combinations of coated cores and non-coated cores may also be possible. In each of these embodiments and variants, the pores of the cores enclose quantum dots.

Figure 2B:
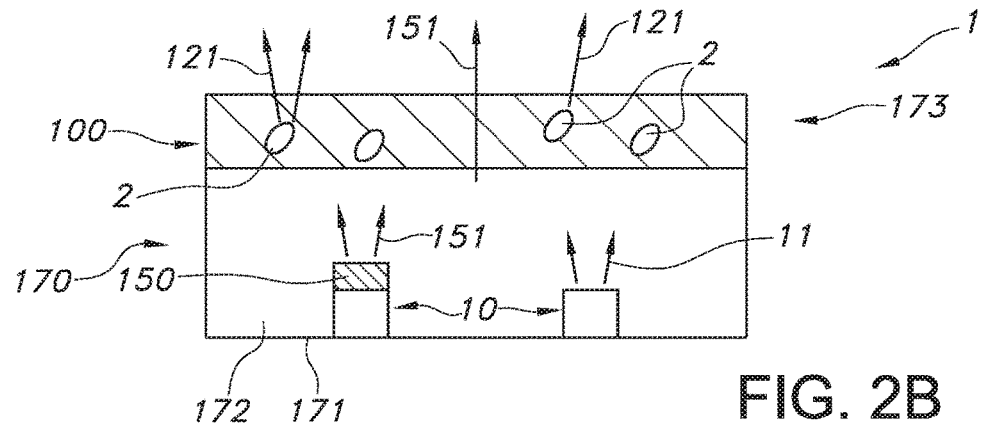
Figure 2C:
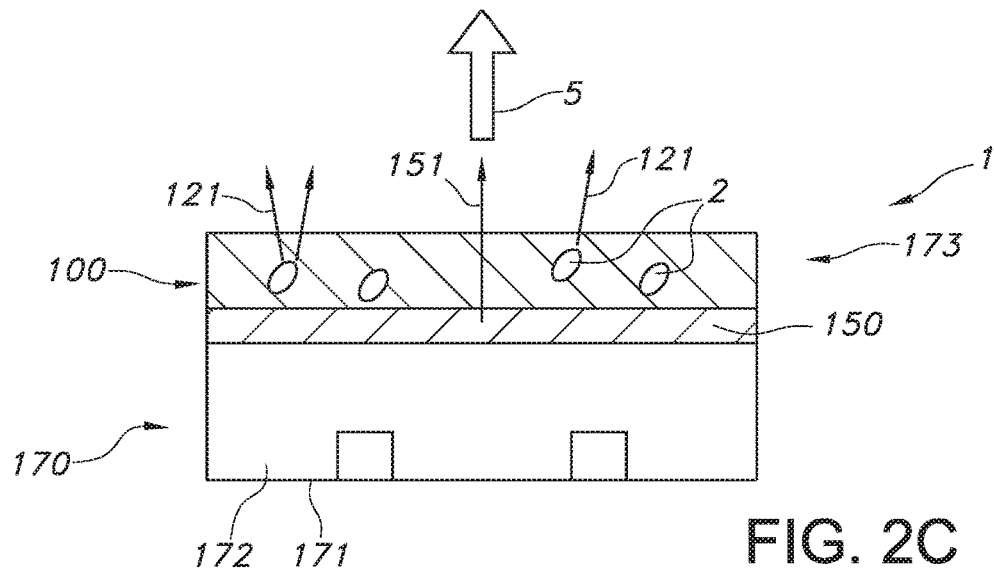

Here, and also in the schematically drawings 2b and 2c, a module 170 is shown, with a wall 171, a cavity 172, and a transmissive window 173. The wall 171 and the transmissive window 173 here enclose cavity 172. In FIGS. 2a-2c, the transmissive window 173 is used as an envelope, or as part of an envelope. Here, the transmissive window envelopes at least part of the cavity 172. Note that the transmissive window is not necessarily flat. The transmissive window, comprising in embodiments the matrix, may also be curved, like in the embodiment of a TLED or in a retrofit incandescent lamp (bulb).

In FIG. 2b, by way of example, the second luminescent material 150 is arranged as part of one or more of the light sources 10. For instance, the light source 10 may comprise a LED with the second luminescent material 150 on the dye or dispersed in a (silicone) dome.

In FIG. 2c, by way of example the second luminescent material 150 is applied as (upstream) coating to the transmissive window 173, which again in this embodiment comprises the light converter 100.

Figure 2D:
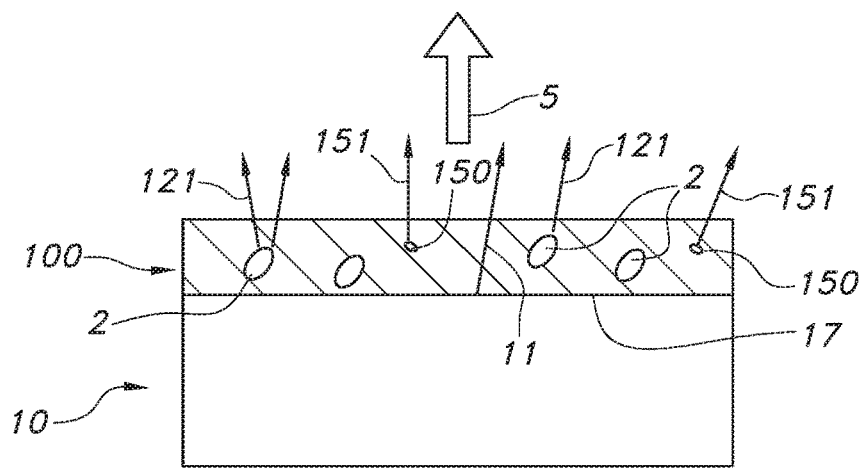

FIG. 2d schematically depicts an embodiment wherein the luminescent material 2, or in fact the light converter, is directly applied on the light exit face of a light source 10, here e.g. the LED die 17 of a LED.

Hence, the second luminescent material can e.g. be present in the first polymeric material (110) or the light transmissive solid matrix (420).

Figure 2E:
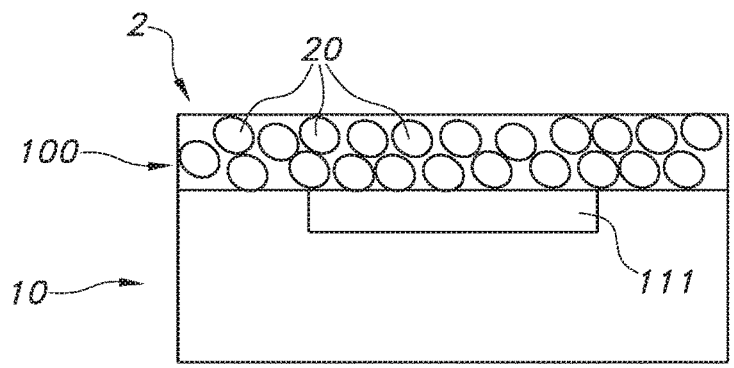
Figure 4:
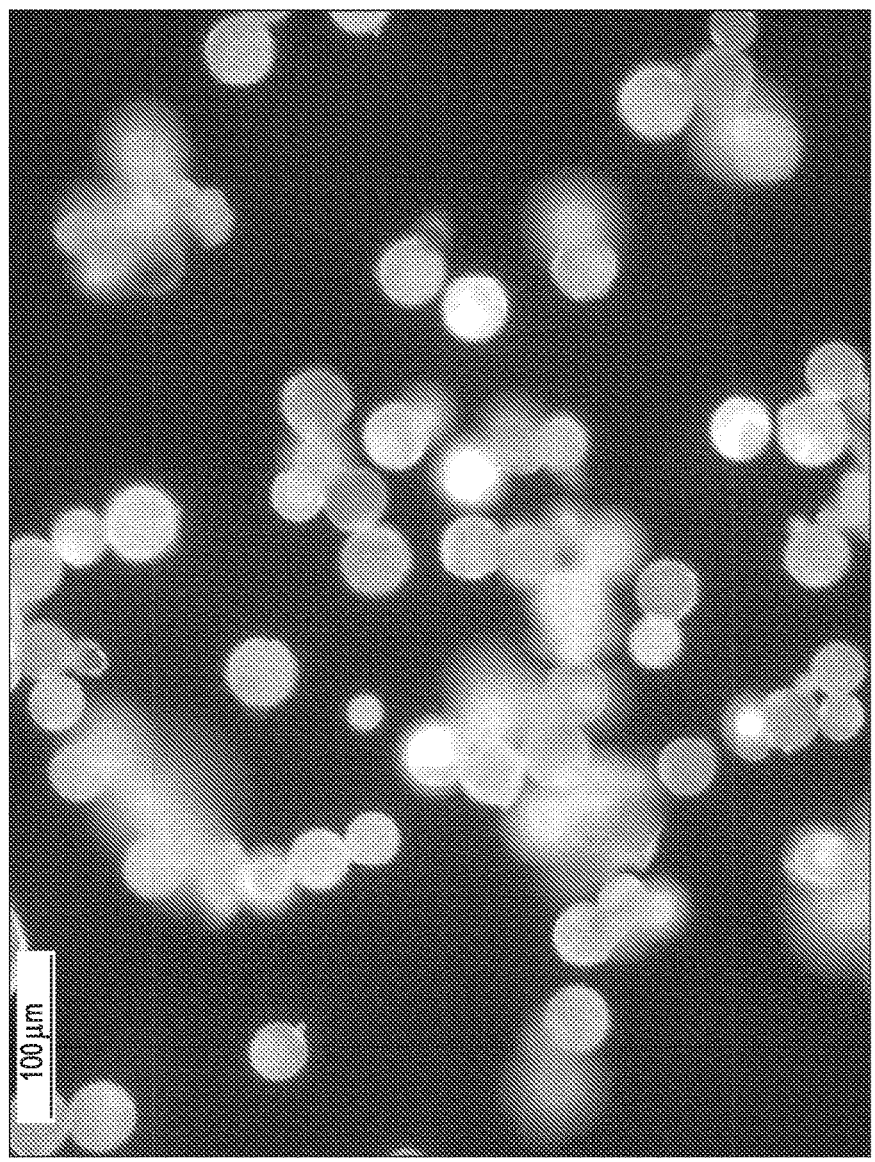
FIG. 4 shows a fluorescent microscope image showing that these particles show bright QD emission.

FIG. 2e schematically depicts a light source 10 with a layer of luminescent material 2. For instance, this layer may be arranged on (the surface of) a LED die 111.

Other configurations are also possible, like for instance a plurality of LEDs, or other light sources, in contact with (an extended) light converter 100. As indicated above, another term for light converter is wavelength converter. For instance, the light converter may be a dome like light converter, with one or more light sources, especially LEDs, adjacent thereto.

Hence, in an embodiment QDs are dispersed in an ink of monomers/oligomers that can be cured upon irradiation or heating or polymerized. Ideally, the QDs are well-dispersed, and the QD-host combination is known to show highly stable behavior under blue flux and elevated temperature (such as between 50 and 150° C., or especially between 75° C. and 125° C.). Macro porous silica with a size of 0.5-500 um and pores of 0.1-10 um are mixed with the QD-ink, and the ink is allowed to fill the micro pores of the silica particles. Filling of the pores may be facilitated by evacuating the porous particles before adding the QD-ink. The filled composite particles are isolated from the mixture, and the ink within the particles is cured or polymerized. The cured or polymerized composite particles are optionally subsequently coated with an inorganic seal material.

By way of example, some QD-ink combinations are mentioned:
QDs dispersed in acrylates (monomers or oligomers)
QDs dispersed in silicones (mainly oligomers)
QDs dispersed in epoxies (monomers or oligomers)
QDs dispersed in any other curable polymer resin (monomers or oligomers)

Prior to filling it is preferred to completely dry the porous particles to reduce the water content to a minimum. Typically a sintering step is used to dry the porous silica or other porous material.

After curing or polymerization of the QD-ink within the (silica) particles the composite particles are isolated. The isolated composite particles are then optionally sealed with preferably an inorganic coating using:
Deposition technique from gas-phase, using a fluidic bed reactor (PVD, ALD, etc.)
Growing an inorganic shell from precursor materials in a chemical (wet chemical or chemical vapor deposition) synthesis Alternatively an organic seal material such as an epoxy or perylene or parylene is deposited on the outside of the composite particle.

Alternatively, the isolated porous particles can be inserted directly (without sealing) into a hermetic host material, such as an epoxy (e.g. DELO Katiobond 686) or low-melting point glass.

The end result is a sealed composite QD/polymer/inorganic material particle which can be processed further in air, similar to how YAG:Ce phosphors are currently treated. The particles can for example be mixed with an optical grade silicone and then deposited on the LED or substrate.

Below examples especially describe routes wherein porous silica particles (Trisoperl) are first impregnated with QD-acrylic matrix, then filtered to remove excess acrylic, and then cured. After the curing step, the particles may optionally be washed with toluene or other solvent. As expected, it is found that the porous silica particles are filled with acrylic after all these steps.

First, it was shown that impregnation of porous silica particles with acrylic can be followed in-situ by a microscope: porous silica particles that are non-filled and embedded in a liquid appear black due to scattering. Filled porous silica particles appear transparent. Filling of porous silica particles can therefore nicely be recorded. As examples, Ebecryl 150 and Sylgard 184, a PDMS silicone, were used. porous silica particle within the liquids are black due to scattering, but the porous silica particle with liquid inside the droplet are transparent (hence filled). It is hereby shown that a high viscous silicone such as Sylgard 184 or an acrylate easily fill up the pores of the porous silica particles. In high viscous Ebecryl, it was observed that filling takes roughly 100-500 seconds, in low viscous IBMA (Isobornyl methacrylate) it was observed that filling is a matter of seconds. Eventually, all particles appear transparent.

FIG. 3 shows the impregnation of Trisoperl PSPs in ebecryl 150 at different time intervals. It is seen that the particles at short time interval still have a partly black interior, which is slowly disappearing over time. In high viscous Ebecryl, it was observed that filling takes roughly 100-500 seconds, in IBMA it was observed that filling is a matter of seconds. Eventually, all particles appear transparent.

When the in-situ impregnated particles are exposed to UV-light (which can be done under a microscope ("in-situ") as well), "cracking" within the interior of the particles is observed. This is attributed to shrinkage of the acrylic upon cure (can be up to 10%), and subsequent delamination of the acrylic from the interior walls, creating new scattering pores. For silicones the shrinkage seems to be much smaller (few percent) and the cracking is not observed.

An embodiment of the impregnation process was performed, consisting of the following step:
1—Mix QDs (0.1-1 wt. %) in ebecryl 150 or a 80/20 mixture of IBMA/HDDA
2—Add 0.5% wt irgacure (optional)
3—Add 1 gram of triosperl porous silica particles to 5 gram of the QD-acrylic mixture
4—Gently stir/shake for 10 minutes
5—Apply the QD-acrylic-porous silica particle mixture on a filter, which is placed on a Buchner funnel
6—Apply vacuum to the funnel for 1-10 minutes
7—Flush the porous silica particles on the filter with ethanol, heptanes, toluene, or another solvent (optional)

8—Remove the powder from the filter
9—Spread the powder over a glass plate or vial and cure with UV under N2 flow
10—Disperse the cured powder in toluene and apply an ultrasound treatment
11—Remove the toluene, resulting in the impregnated powder.

Amongst others, 0.1% wt QDs and 0.5% wt. PI (photo initiator), which are impregnated and cured according to step 1-9 (but without step 7).

In a further example, Trisoperl particles were impregnated according to step 1-11, without step 7. In this case, a 0.1% wt dispersion of Crystalplex QDs in heptanes was made in IBMA/HDDA (5 g) to which 1 gram of porous silica particles were added, and 0.5% wt photoinitiator (irgacure). After filtration the powder was cured for 10 minutes in an N2 flow with UV light. This results in a sticky powder, which was converted into a loose powder of individual porous silica particles by dispersing it in toluene and giving it a 1 minute US treatment. The toluene was removed and the particles were applied on a glass disc for in-situ investigations under the microscope. When these porous silica particles were brought into contact with Ebecryl, the particles did not show re-filling, but were transparent instantaneously. In addition, some particles exhibit a brown color and cracks, which indicates that the acrylate within the particles is cured, and does not re-fill again. This is explained by the fact that porous silica particles that are well impregnated and cured will have clogged pores that does not allow for a (quick) secondary fill with ebecryl. However, it is sometimes observed that these can be re-filled with toluene, which is not surprising in view of its low viscosity.

The fluorescent microscope image (FIG. 3) shows that these particles show bright QD emission. Here, Trisoperl porous silica particles impregnated with 0.1% wt QDs in IBMA/HDDA. The porous silica particles were cured and given an ultra sonic treatment in toluene, after which they were spread out on a glass plate, to which a droplet of Ebecryl was added.

Different silica particles were tested on their suitability of the present process for making the luminescent material. A non-exhaustive list is given in table 2 below:

TABLE 2 listing of some silica particles that were used in the experiments

| | Particle size (μm) | Pore size (nm) |
|---|---|---|
| Type 1 | 30-70 | 100-450 |
| Type 2 | About 30 | About 160 |
| Type 3 | About 30 | 150-200 |

Especially type 3 are very spherical particles (circularity over 0.95), which facilitates the application of a coating on the particles (if desired).

Stability measurements on the quantum dot filled particulate porous luminescent material were performed under N2 flow. It appeared that the stability of the QDs in the porous silica particles is very similar to the same commercial QD-based nanoparticles directly dispersed in IBMA/HDDA without porous particles. However, the present luminescent material is easy to handle, can be used in state of the art coating processes or matrix dispersing processes, and does not need oxygen and/or water free environments. It also appears that the quantum efficiency of the QD's in the pores is about the same or even the same as those of the original quantum dots.

Mercury porosimetry was used to determine the degree to which the pores of the silica particles were filled after the impregnation step. First, it was determined that the Trisoperl particles without any treatment have a specific pore volume of 1.09 cm3/g powder. Second, it was determined the specific pore volume of Ebecryl and IBMA/HDDA filled Trisoperl particles without a solvent washing step (step 7) is 0.06 cm3/g (Ebecryl) and 0.00 cm3/g (not detectable) (IBMA/HDDA), respectively. This confirms that the Trisoperl particles are almost complete filled with cured acrylic ink.

Using the impregnation method described above (using Buchnel funnel), subsequently an ALD coating around the impregnated particles was applied. In some experiments, the coating comprises 50 nm of alumina. With ALD coating, the stability of QDs in air is improved (relative to impregnated particles without acoating). With ALD coating, it is shown that the QD stability in air is similar to the stability in Nitrogen, which shows that the ALD coating is successfully applied, and keeps water/air outside the impregnated particles. The experiments are described in further detail below.

Example 1 Preparation of Impregnated Particles

Trisoperl particles were impregnated according as follows: 1 gram of 5% wt dispersion of Crystalplex QDs in heptanes was added to IBMA/HDDA (5 g). This results in a 1% wt dispersion QDs in IBMA/HDDA, to which 1 gram of PSPs were added, and 0.5% wt photoinitiator (irgacure 184). The powder-acrylate mixture was put on a Buchner funnel, and filtrated for a few minutes in the glovebox. After filtration the powder was cured for 4 minutes with UV light in the glovebox. This results in a sticky powder, which was converted into a loose powder of individual PSPs by dispersing it in toluene and giving it a 15 minute US treatment in a close vial, hence no contact with ambient air. Next, the toluene was removed in the glovebox, by decanting, followed by evacuation of a few hours to remove all toluene. FTIR measurements show that the acrylic has a 95% conversion rate, which means a nearly complete curing of the acrylate. A subset of these particles was mixed into ebecryl 150 for QE and stability measurements. The QE of these QDs was measured to be 51% and 52% for two different impregnation experiments. The QE of the QDs in HDDA/IBMA without impregnation was measured at 69%. This means there is a loss in QE upon impregnation, curing, and bringing into a second matrix. The reason for this drop is unclear, but likely due to the additional processing steps. The QE data are summarized in Table 3.

Example 2 Plasma Enhanced ALD on Impregnated PSP 50 mg of the impregnated PSP (batch 1) was spread out over a silicon wafer (outside the glovebox), and inserted into the Emerald chamber (for plasma enhanced ALD) of an ASM dual chamber ALD system. A 50 nm alumina layer was applied using the plasma-enhanced ALD process at 100 C, using TMA (trimethylaluminium) and O2 as reactive gasses. After deposition, the powder was harvested and mixed into Ebecryl 150 (with 1% wt irgacure 184) to make cured films of the ALD-coated PSP's in a secondary matrix. As described above in example 1, reference samples of the same impregnated PSP's without ALD were also made, in addition to films of plain QDs in IBMA/HDDA (no impregnation). In all cases, the samples consisted of a 100 um acrylic layer, in between two glass plates. The QE of the ALD-coated PSP's using plasma enhanced ALD (called sample ALD-a from here on) had a QE of 50%, which is the same as before ALD coating (batch 1, 52%). The ALD coating thus has (almost) no impact on the QE of the QDs.

TABLE 3 overview of QE data on various films:

| Description | ALD | PL QE (%) |
|---|---|---|
| QDs in IBMA/HDDA (no impregnation) | No ALD | 69 |
| QDs in IBMA/HDDA impregnated PSP - batch 1 | No ALD | 52 |
| QDs in IBMA/HDDA impregnated PSP - batch 2 | No ALD | 51 |
| ALD -a coated PSP batch 1 | Plasma @ 100° C. | 50 |
| ALD -b coated PSP batch 1 | Thermal @ 150° C. | 31 |
| ALD -c coated PSP batch 2 | Thermal @ 100° C. | 33 |

The QE's are relatively low. This is due to the fact that commercial QD material was used with a relative low initial QE. Much higher QE's are possible when QDs of a better quality are applied, but those are not readily commercially available on a large scale.

Figure 5A:
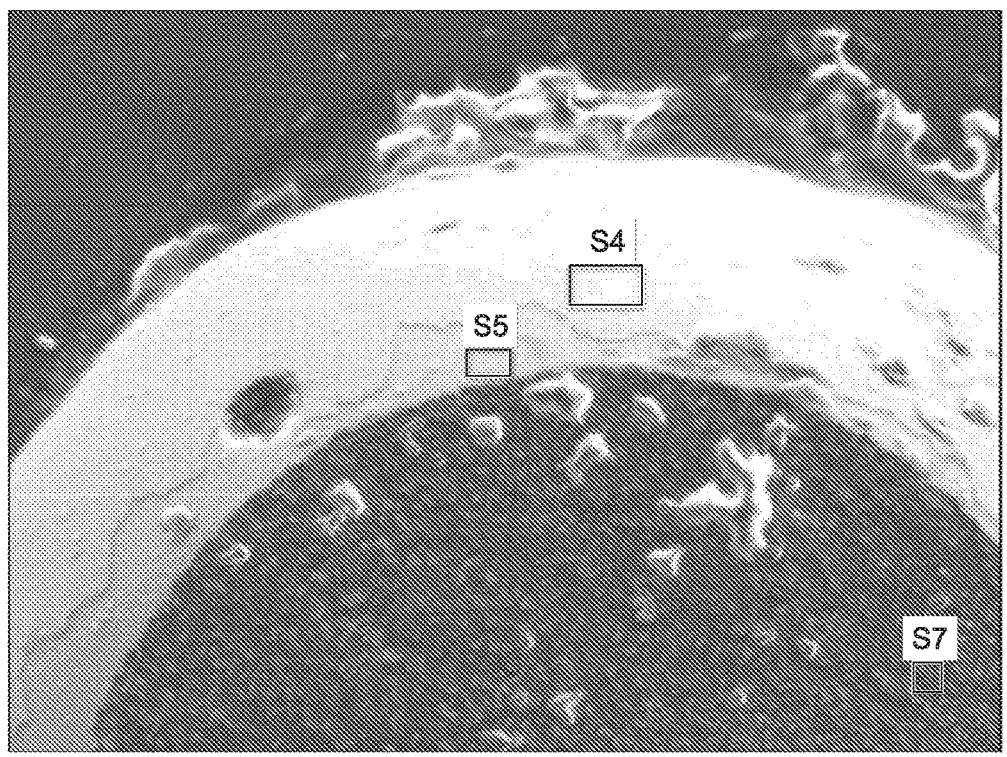
FIG. 5a shows a HR-SEM image of a cross-section of an ALD-a particle.
Figure 5B:
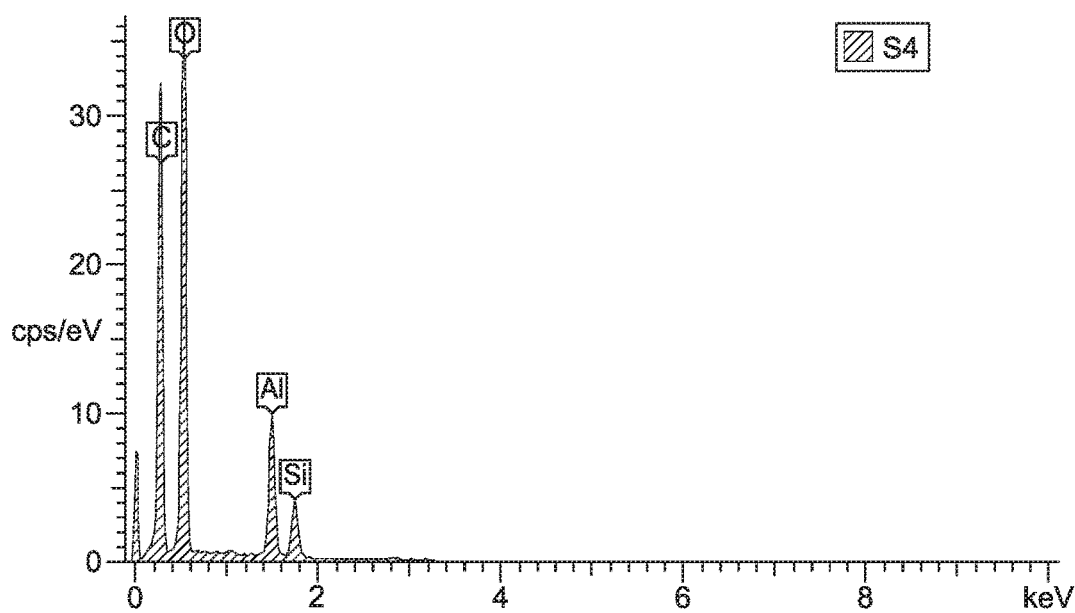
FIGS. 5b-5d, respectively, show the elemental analysis by EDX of the regions indicated in the HR-SEM FIG. 5a (image spectra 4, 5, 7, respectively).
Figure 5C:
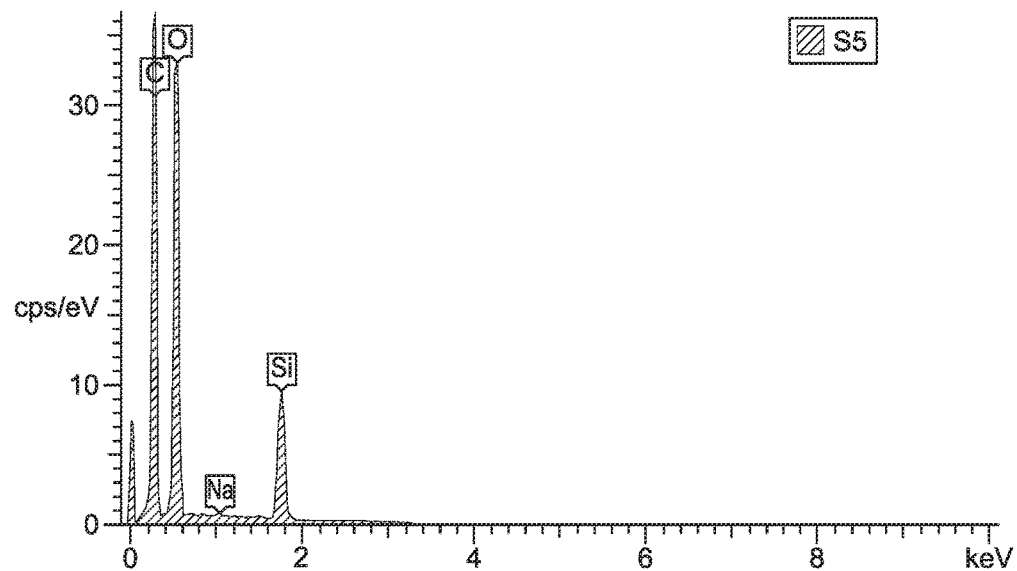
Figure 5D:
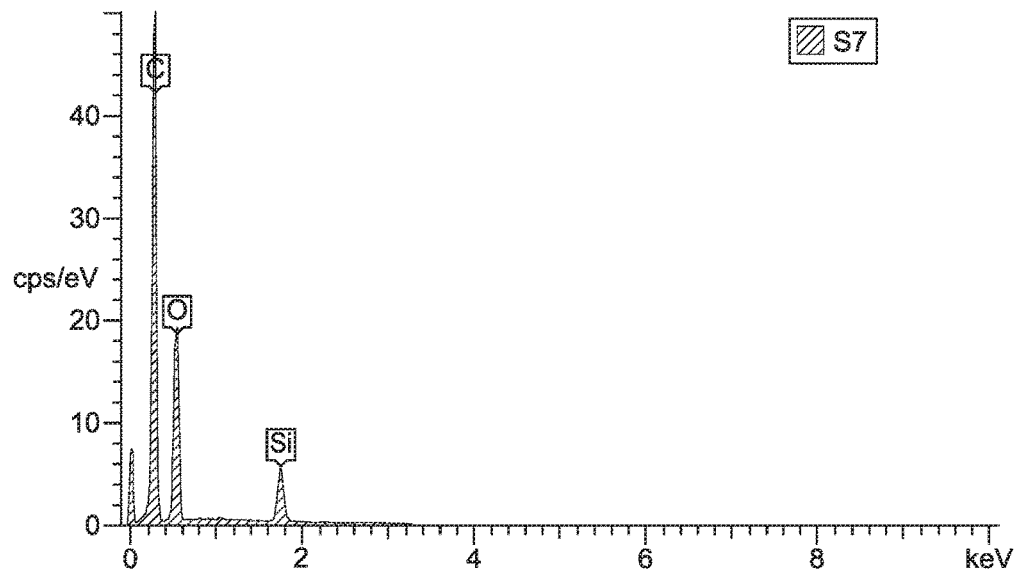

A small part of the ALD coated particles from ALD-a was used to make cross-sections and investigate in SEM. FIG. 5a shows a SEM image of PSP's with ALD-a coating. In the prepared Schliffs (cross-sections) some of the particles were not fully embedded in the epoxy carrier. As a result the images provide a 3D view on the particle, where 3 different regions can be identified. In addition, these particles offered the possibility to analyze the coating of the particles using selected area EDX. The first region is the interior of the PSP (e.g. at location of spectrum 7), where the porous structure can be clearly identified. The EDX recorded at location "spectrum 7" is also shown, in which only silicon can be observed, no aluminium. The second region is the outside of the PSP, where a more dense silica shell is present (called "egg-shell" from here on). It is known from these particular PSPs that they have a dense silica shell around the particle, except for some "fill-openings" (see also SEM images in appendix). An EDX spectrum recorded at this region (spectrum 5) indeed shows only silicon. The third region that can be identified is an additional thin layer on top of the "egg shell", which is the aluminium oxide layer applied by ALD. The EDX spectrum recorded at this location (spectrum 4) clearly shows that indeed aluminium is present, confirming that the ALD coating has resulted in deposition of alumina on the shell of the particles. In the SEM image it can be seen that this second layer is very conformal. The fact that at the top part (at location of spectrum 5) the silica egg shell is exposed is attributed to the grinding applied to make the cross-sections (preparation of schliffs).

From the SEM image and EDX it appears that the alumina coating is quite conformal and also covers the fill openings. However, the SEM may not be very quantitative in determining the exact coverage by alumina, and also may not provide statistical information to which extent all particles are coated equally well. XPS (X-ray photo spectroscopy) is a technique which probes the outer few nm of substrates on elemental composition. An analysis of XPS on the plasma-enhanced ALD coated particles (ALD-a) are summarized in Table 4, where a comparison is made with an uncoated PSP (no ALD batch 1). The uncoated particles show only silica, and some Cd, Zn, and Se from the QDs. The organic material likely originates from contamination from the substrate, or acrylic exposed to the outside. In contrast, the ALD-coated particles display primarily aluminium oxide as inorganic coating, and most importantly no silicon could be detected. Since the detection limit of silicon in this measurement is ~0.1%, it is concluded that at least 99% of the surface has been coated with aluminium oxide.

TABLE 4 summary of XPS measurements on sample ALD-a, and a blanc (no ALD coating). Numbers give the atomic weight %, and sum up to ~100%:

| | Al 2p | C 1s | Cd 3d | O 1s | Se 3p3 | Si 2p | Zn 2p3 |
|---|---|---|---|---|---|---|---|
| Peak | 74.2 | 284.8 | | | | 103.5 | |
| Present as | Al2O3 | org | | | | SiO2 | |
| Blanc | — | 46 | 0.5 | 39 | 0.3 | 14 | 0.81 |
| ALD-a | 22 | 32 | — | 47 | — | — | 0.03 |

Since the ALD coating is applied to improve the stability of QDs in air, the photoluminescence stability was measured before and after impregnation, and with and without ALD coating. All measurements were performed under the same conditions of 10 W/cm2 blue flux (using a 450 nm blue laser), and 100° C. temperature. The fast drop seen in these measurements after ~5000 seconds is due to the raise in temperature from 25° C. to 100° C.; the thermal quench causes a quick drop in PL intensity.

FIG. 6a shows the stability curves of the reference sample of QDs in IBMA/HDDA without impregnation (QE of 69%), and with impregnation (batch 1, QE of 52%). The samples were first measured in a flow of nitrogen, with the 100 μm QD film still sandwiched between two glass plates to avoid any diffusion of water/air into the sample. The curves show fairly similar behavior, with a degradation rate after ~250.000 seconds of 1.3E−6 and 1.5E−6 s−1 respectively. Such degradation under these conditions is very typical for this combination of commercial QDs and IBMA/HDDA acrylic. The results shows that the impregnation process as such has no effect on the QD PL stability. There is a difference visible between the two curves initially; the curve 3 shows more photobrightening than the curve 1. Photobrightening is a phenomenon observed frequently for QDs, is not well understood, and also beyond the scope of this invention. Hence, we will not go into details of this photobrightening effect further.

When both samples are measured in air (where the top glass plate was removed to allow water/air to quickly reach the laser spot) the samples show a dramatic increase in degradation rate. The impregnated sample appears to behave slightly better than the sample without impregnation, which may be attributed to the longer diffusion length of water/air into the silica particles.

FIG. 6b shows the same stability curves of the impregnated sample without ALD in N2 and in air, and in addition the stability curve of the impregnated samples with Plasma Enhanced ALD coating (sample ALD-a). First, in N2 atmosphere it is observed that the stability of the impregnated sample is not affected by the ALD coating; after 250.000 seconds it shows a very similar degradation rate of 1.4E−6 s−1. Fluorescence microscopy shows that the total impregnated sphere luminesces: there is no 'dead skin' caused by the deposition process. Most importantly, a clear difference in stability between the ALD coated and non-coated sample is observed when measured in air. The ALD-coated sample shows a degradation rate in air that is very similar to that in N2 (again 1.4E−6). The fact that the degradation rate in N2 and air are so similar, provides evidence for the fact that the ALD coating is very effective in keeping water/air outside the silica particle.

Example 3 Thermal ALD@150 C on Impregnated PSP 30 mg of the impregnated PSP (batch 1) was spread out over a silicon wafer (outside the glovebox), and inserted into the Pulsar chamber (for thermal ALD) of an ASM dual chamber ALD system. A 50 nm alumina layer was applied using the thermal ALD process at 150 C, using TMA (trimethylaluminium) and O3 as reactive gasses. After deposition, the powder was harvested and mixed into Ebecryl 150 (with 1% wt irgacure 184) to make cured films of the ALD-coated PSP's in a secondary matrix. The QE of the ALD-coated PSP's using thermal ALD at 150° C. (called sample ALD-b from here on) had a QE of 31%, which is a drop of 20% compared to before ALD coating (batch 1, QE of 52%).

A small part of the thermal ALD coated particles from ALD-b was used to make cross-sections and investigate in SEM. FIG. 7a shows a SEM image of PSP's with ALD-b coating. In the prepared Schliffs (cross-sections) some of the particles were not fully embedded in the epoxy carrier. As a result the images provide a 3D view on the particle, where 3 different regions can be identified. In addition, these particles offered the possibility to analyze the coating of the particles using selected area EDX. The first region is the interior of the PSP (at location of spectrum 3 (S3) (FIG. 7d)), where the porous structure can be clearly identified. The EDX recorded at location "spectrum 3" is also shown, in which only silicon can be observed, no aluminium. The second region is the outside of the PSP, where a more dense silica shell is present (called "egg-shell"). It is known from these particular PSPs that they have a dense silica shell around the particle, except for some "fill-openings" (see also SEM images in appendix). An EDX spectrum recorded at this region (spectrum 2; S2 (FIG. 7c)) indeed shows only silicon. The third region that can be identified is an additional thin layer on top of the "egg shell", which is the aluminium oxide layer applied by ALD. The EDX spectrum recorded at this location (spectrum 1; S1 (FIG. 7b)) clearly shows that indeed aluminium is present, confirming that the ALD coating has resulted in deposition of alumina on the shell of the particles. In the SEM image it can be seen that this alumina layer is very conformal. The fact that at the top part (at location of spectrum 2 (S2)) the silica egg shell is exposed is attributed to the grinding applied to make the cross-sections (preparation of schliffs).

As mentioned above, the PSP are covered by a dense "egg shell" of silica, and have a few so-called fill openings per particles, which allows impregnation of the particles by the QD-acrylic ink. To ensure a complete seal of the PSP, also the fill-opening needs to be coated with alumina. FIGS. 8a-8b show SEM images of such fill openings of PSPs that are not coated with ALD (FIG. 8a, PSP batch 1) and of PSPs that are coated with thermal ALD (FIG. 8b, ALD-b). The non-coated PSP clearly shows that the egg-shell (bright ring) is discontinuous at this opening (in SEM, a bright appearance reflects a high density of inorganic material). The ALD-coated sample shows that the fill-opening has been coated by alumina, and that the alumina actually protrudes into the pores. It is known that ALD coatings can be very conformal because the molecular precursors can diffuse/penetrate into small pores (such as the 200 nm pores here). For that reason, the overall alumina deposition in this porous area of the fill opening is likely to be higher than on top of the egg shell (which is rather smooth), which can be qualitatively recognized by the relatively "thick" brighter appearance of the outer part of the fill opening compared to the coating around the egg shell. It is anticipated that the filling of these pores by ALD coating is beneficial to obtain a well sealed PSP.

Example 4 Thermal ALD@100 C on Impregnated PSP 100 mg of the impregnated PSP (batch 2) was spread out over a silicon wafer (outside the glovebox), and inserted into the Pulsar chamber (for thermal ALD) of an ASM dual chamber ALD system. A 50 nm alumina layer was applied using the thermal ALD process at 150° C., using TMA (trimethylaluminium) and O3 as reactive gasses. After deposition, the powder was harvested and mixed into Ebecryl 150 (with 0.5% wt irgacure 184) to make cured films of the ALD-coated PSP's in a secondary matrix. The QE of the ALD-coated PSP's using thermal ALD (called sample ALD-c from here on) had a QE of 33%, which is a drop of 20% compared to before ALD coating (batch 2, 51%). This, and previous example show that thermal ALD causes a substantial drop in QE, which cannot be attributed to solely temperature, since ALD-a (plasma enhanced) was also performed at 100° C. The ozone used for thermal ALD could be the cause for the drop in QE, but this was not investigated further.

From the edx in example 3 it is not conclusive that the aluminium oxide coating is 100% conformal, neither does it give statistical information over all particles. An analysis of XPS on thermal-enhanced ALD coated particles at 100° C. (a duplo experiment of ALD-c) shows that no silica can be observed anymore after alumina deposition. It is concluded that both plasma enhanced and thermal ALD are able to conformally coat the surface of these porous silica particles with at least 99% coverage.

Since the ALD coating is applied to improve the stability of QDs in air, the photoluminescence stability was measured before and after impregnation, and with and without ALD coating. All measurements were performed under the same conditions of 10 W/cm2 blue flux (using a 450 nm blue laser), and 100 C temperature.

The stability of impregnated versus non-impregnated samples was discussed in example 2, and showed that impregnation has no influence on the QD PL stability in N2. However, in air, a dramatic degradation was observed for both cases. FIG. 6c summarizes the results of impregnated PSP without ALD coating (batch 1, also shown in example 2), and with thermal ALD coating (ALD-c). The curve 3 in FIG. 6c shows that the PL stability of QDs is not affected by the ALD coating, since it is very similar as compared to without ALD coating (curve 1). In addition, it is clear that the sample with ALD coating shows a very similar decay rate in N2 as compared to air after 250.000 seconds (1.3E–6 and 1.9E–6 s–1 respectively), whereas the non-ALD samples shows much worse stability in air compared to nitrogen. Again, it is concluded that also a thermal ALD coating is very effective in keeping water/air outside the porous silica particles.

FIGS. 6b and 6c show the curves (curve 3 in both figures) for "Impregnated ALD-a/c, air" which are in fact a continuation in time of the same samples indicated in the same graphs, respectively, as "Impregnated ALD-a/c, N2". Only the starting point is again at 0 seconds. Note that the end intensity of the N2-curve (curves 3) is about equal to these starting intensity of the air-curves (curves 4). This is also the reason that the air curves do not show the above-mentioned photobrightening. FIG. 6d shows the curve (curve 4) "Impregnated ALD-c, air" which is obtained after the impregnated ALD particles are directly subjected to photoluminescence measurements under air conditions (thus without an earlier measurement of the PL as function of time under N2). Here, again the initial photobrightening is perceived.

As indicated above, it is concluded that also a thermal ALD coating is very effective in keeping water/air outside the porous silica particles. Hence, an alumina ALD coating was applied to the particulate porous inorganic material, to allow a good analysis of the shell by EDX after coating (an alumina coating on the silica particle may be easier analyzed than a silica coating on the silica particles). However, a silica coating can be applied by an exact same ALD procedure.

The HR-SEM images also show that there is hardly any contamination of acrylics on the outside of the particles. The shell and ALD coating are fairly smooth. Here, a stationary ALD coating technique (powder on a wafer) has been used, which already gives very promising results. Powder coating using eg fluidized bed ALD should give at least similar, if not better results. In addition, powder coating ALD should also enable the coating of larger amounts of powder. Coating of multi-gram powder batches are known in the field.

Note that the invention is not limited to coatings (or shells) on the cores obtained by the ALD process. Also other processes may be applied.

Example 5: Example Impregnation of Trisoperl Particles with Low Molecular Weight Silicone Commercial QDs from crystalplex were modified with a siloxane ligand as described in PCT/IB2013/059577, which is herein incorporated by reference). The ligand used was a 5000 Mw siloxane molecule (AB109373, viscosity ~100 cSt.) with an amine functional group in the side chain, where the amine group was first converted into a carboxylic acid as described in PCT/IB2013/059577 before ligand exchange. The ligands bind to the QD surface through the carboxylic acid, and the siloxane ligands make the QDs miscible into low molecular weight silicones (below 100 cSt.).

After ligand exchange the QDs were purified once by adding 1 ml heptane and 2 ml of ethanol to 500 ul of QD-ligand mixture (~1% wt QDs). The QD pellet was redispersed in 250 ul heptanes (hence 2% wt QDs). The 250 ul purified QDs in heptane was added to 0.5 gram of AB109380 (25-35% Methylhydrosiloxane-dimethylsiloxane copolymer; viscosity 25-35 cSt.) which gave a transparent mixture (not possible without the siloxane ligand).

To 2 gram of AB 109356 (Polydimethylsiloxane, vinyldimethylsiloxy terminated; viscosity 100 cSt.), 4 ul of a 100 times diluted solution of a platinum catalyst in xylene (AB146697 (Platinum-divinyltetramethyldisiloxane complex; (2.1-2.4% Pt)) was added. The QD-AB109380 mixture and the Pt-109356 mixture were combined and vigorously stirred for a few minutes, resulting in a clear and transparent curable QD-silicone mixture (0.2% wt QDs).

To the mixture, 0.5 gram of triosperl particles were added, and mixed for 1 minute to allow impregnation. The QD-silicone-triosperl mixture was put on the filter of a Buchner funnel, and evacuated for 5 minutes. The excess QD-silicone liquid was removed in this manner, and a fairly dry but slightly sticky powder remained on the Buchner funnel. The resulting impregnated powder was investigated under the microscope, and from the bright field image it was concluded that the particles were properly impregnated with the QD-silicone liquid (not a black but shiny appearance). In fluorescence microscopy, bright fluorescence from the impregnated particles is observed.

Next, the triosperl particles impregnated with the QD-silicone mixture were cured. It can be observed that the shiny appearance in the bright field image partly disappears after 5 minutes curing, and completely disappears after 90 minutes curing. After 90 minutes curing the particles have a black appearance, which is attributed to shrinkage of the silicones upon curing (which is more pronounced for low molecular weight silicones as compared to high molecular weight silicones), which results in "cracking" within in the pores. The cracks cause scattering of the light, giving the black appearance (also observed for acrylate filled particles).

Finally, the cured impregnated triosperl particles were brought mixed into toluene and sonicated for 2 minutes. The ultrasonic treatment caused the particles to de-agglomerate into a fine dispersion of impregnated particles in toluene. After the ultrasonic treatment the particles were brought into Ebecryl 150 (a high viscous acrylate). Bright field microscopy images of the cured impregnated triosperl particles showcase a black appearance, which remained. In other words, no re-filling of the porous particles is observed (which causes the particles to become non-scattering). For non-impregnated particles, re-filling is observed within tens of seconds. For the silicone impregnated particles this was not the case.

Fluorescence microscopy of the impregnated and cured triosperl shows uniform luminescence over the particle for all particles. In summary, it is also shown that the triosperl particles can impregnated with a curable QD-silicone mixture, cured, and washed with the ultrasonic treatment in toluene resulting in a fine de-agglomerated powder.

AB 109356 refers to Polydimethylsiloxane, vinyldimethylsiloxy terminated; viscosity 100 cSt.; AB109380 refers to 25-35% Methylhydrosiloxane-dimethylsiloxane copolymer; viscosity 25-35 cSt; AB146697 refers to Platinum-divinyltetramethyldisiloxane complex in xylene; (2.1-2.4% Pt). These chemicals were purchased from ABCR.

The invention claimed is:

1. A process for the production of a luminescent material, the luminescent material comprising particles having a porous inorganic material core with pores which are at least partly filled with a polymeric material with luminescent quantum dots embedded therein, the process comprising:
   impregnating the particles of the particulate porous inorganic material with a first liquid comprising the luminescent quantum dots and a curable or polymerizable precursor of the polymeric material, to provide pores that are at least partly filled with said luminescent quantum dots and curable or polymerizable precursor; and curing or polymerizing the curable or polymerizable precursor within pores of the porous material.

2. The process according to claim 1, wherein before curing or polymerizing but after impregnating the particles, the impregnated particles and first liquid are separated.

3. The process according to claim 1, wherein the pores of the porous inorganic material are hydrophobized.

4. The process according to claim 1, wherein the particles have particle sizes in the range of 1-500 μm.

5. The process according to claim 1, wherein the process further comprises applying an encapsulation to the particles obtained after curing or polymerizing.

6. The process according to claim 5, wherein the process further comprises providing the encapsulation by at least partly coating the particles with an inorganic coating selected from the group consisting of a silicon containing oxide, an aluminum containing oxide, a zirconium containing oxide, a glass, a titanium containing oxide, a hafnium containing oxide and an yttrium containing oxide.

7. The process according to claim 5, wherein the process further comprises providing the encapsulation by multi-layer coating the particles, wherein the thus obtained multi-layer coating comprises an organic polymer coating and an inorganic coating, or at least two coatings selected from the group consisting of a silicon containing oxide, an aluminum containing oxide, a zirconium containing oxide, a glass, a titanium containing oxide, a hafnium containing oxide and an yttrium containing oxide.

8. The process according to claim 5, wherein the process further comprises providing the encapsulation by at least partly coating the particles by atomic layer deposition.

9. The process according to claim 5, wherein the process further comprises one or more of providing the encapsulation by embedding the particles in a light transmissive solid matrix, or providing the encapsulation by at least partly coating the particles and subsequently embedding the particles in a light transmissive solid matrix.

10. The process according to claim 1, wherein the porous inorganic material comprises porous silica.

11. The process according to claim 1, wherein the porous inorganic material comprises porous alumina.

12. The process according to claim 1, wherein the porous inorganic material comprises porous glass.

13. The process according to claim 1, wherein the porous inorganic material comprises porous zirconia.

14. The process according to claim 1, wherein the porous inorganic material comprises porous titania.

15. The process according to claim 1, wherein the pores have mean pore sizes in the range of 0.1-10 µm.

16. The process according to claim 1, wherein the precursor comprises a curable acrylate.

17. The process according to claim 1, wherein the precursor comprises silicone.

* * * * *